(12) United States Patent
Bykanov et al.

(10) Patent No.: US 7,671,349 B2
(45) Date of Patent: Mar. 2, 2010

(54) LASER PRODUCED PLASMA EUV LIGHT SOURCE

(75) Inventors: Alexander N. Bykanov, San Diego, CA (US); Norbert Bowering, San Diego, CA (US); Igor V. Fomenkov, San Diego, CA (US); David C. Brandt, Escondido, CA (US); Alexander I. Ershov, San Diego, CA (US); Oleh Khodykin, San Diego, CA (US); William N. Partlo, Poway, CA (US)

(73) Assignee: Cymer, Inc., San Diego, CA (US)

( * ) Notice: Subject to any disclaimer, the term of this patent is extended or adjusted under 35 U.S.C. 154(b) by 144 days.

(21) Appl. No.: 11/786,145

(22) Filed: Apr. 10, 2007

(65) Prior Publication Data

US 2008/0179548 A1    Jul. 31, 2008

Related U.S. Application Data

(63) Continuation-in-part of application No. 11/107,535, filed on Apr. 14, 2005, now Pat. No. 7,368,741, which is a continuation of application No. 10/409,254, filed on Apr. 8, 2003, now Pat. No. 6,972,421.

(60) Provisional application No. 60/903,643, filed on Feb. 26, 2007.

(51) Int. Cl.
     *H04H 1/04*      (2006.01)
(52) U.S. Cl. ................................. 250/504 R
(58) Field of Classification Search ............. 250/504 R, 250/505.1; 378/119, 145
See application file for complete search history.

(56) References Cited

U.S. PATENT DOCUMENTS

| 4,223,279 | A | 9/1980 | Bradford, Jr. et al. | ...... 331/94.5 |
| 4,247,829 | A | 1/1981 | Yagi et al. | ...................... 331/94 |
| 4,251,781 | A | 2/1981 | Sutter, Jr. | ...................... 331/94 |
| 4,414,488 | A | 11/1983 | Hoffmann et al. | ............. 315/39 |

(Continued)

FOREIGN PATENT DOCUMENTS

EP      1434095 A1    6/2004

(Continued)

OTHER PUBLICATIONS

Harilal, et al., "Ion debris mitigation from tin plasma using ambient gas, magnetic field and combined effects," J. Appl. Phys. B—Lasers and Optics, pp. 1-7; *Center for Energy Research, Univ. of Calif.*, San Diego (2006).

(Continued)

*Primary Examiner*—Kiet T Nguyen
(74) *Attorney, Agent, or Firm*—Matthew K. Hillman

(57) ABSTRACT

A device is disclosed which may comprise a system generating a plasma at a plasma site, the plasma producing EUV radiation and ions exiting the plasma. The device may also include an optic, e.g., a multi-layer mirror, distanced from the site by a distance, d, and a flowing gas disposed between the plasma and optic, the gas establishing a gas pressure sufficient to operate over the distance, d, to reduce ion energy below a pre-selected value before the ions reach the optic. In one embodiment, the gas may comprise hydrogen and in a particular embodiment, the gas may comprise greater than 50 percent hydrogen by volume.

32 Claims, 13 Drawing Sheets

U.S. PATENT DOCUMENTS

| | | | | |
|---|---|---|---|---|
| 4,455,658 | A | 6/1984 | Sutter et al. | 372/38 |
| 4,546,482 | A | 10/1985 | Bagaglia et al. | 372/86 |
| 4,686,682 | A | 8/1987 | Haruta et al. | 372/87 |
| 4,703,490 | A | 10/1987 | Brumme et al. | 372/86 |
| 4,742,527 | A | 5/1988 | Wiedemann et al. | 372/87 |
| 4,774,714 | A | 9/1988 | Javan | 372/109 |
| 4,860,300 | A | 8/1989 | Baumler et al. | 372/57 |
| 4,866,682 | A | 9/1989 | Haruta et al. | 372/87 |
| 4,876,693 | A | 10/1989 | Lucero et al. | 372/82 |
| 4,953,174 | A | 8/1990 | Eldridge et al. | 372/87 |
| 4,959,840 | A | 9/1990 | Akins et al. | 372/57 |
| 5,023,884 | A | 6/1991 | Akins et al. | 372/57 |
| 5,025,445 | A | 6/1991 | Anderson et al. | 372/20 |
| 5,025,446 | A | 6/1991 | Kuizenga | 372/21 |
| 5,048,041 | A | 9/1991 | Akins et al. | 372/57 |
| 5,070,513 | A | 12/1991 | Letardi | 372/83 |
| 5,187,716 | A | 2/1993 | Haruta et al. | 372/57 |
| 5,189,678 | A | 2/1993 | Ball et al. | 372/28 |
| 5,247,534 | A | 9/1993 | Muller-Horsche | 372/58 |
| 5,313,481 | A | 5/1994 | Cook et al. | 372/37 |
| 5,315,611 | A | 5/1994 | Ball et al. | 372/56 |
| 5,359,620 | A | 10/1994 | Akins et al. | 372/58 |
| 5,448,580 | A | 9/1995 | Birx et al. | 372/38 |
| 5,471,965 | A | 12/1995 | Kapich | 123/565 |
| 5,535,233 | A | 7/1996 | Mizoguchi et al. | 372/87 |
| 5,557,629 | A | 9/1996 | Mizoguchi et al. | 372/87 |
| 5,646,954 | A | 7/1997 | Das et al. | 372/25 |
| 5,729,565 | A | 3/1998 | Meller et al. | 372/87 |
| 5,763,930 | A | 6/1998 | Partlo | 250/504 R |
| 5,771,258 | A | 6/1998 | Morton et al. | 372/57 |
| 5,790,574 | A | 8/1998 | Rieger et al. | 372/25 |
| 5,852,621 | A | 12/1998 | Sandstrom | 372/25 |
| 5,863,017 | A | 1/1999 | Larson et al. | 248/176.1 |
| 5,875,207 | A | 2/1999 | Osmanow | 372/86 |
| 5,940,421 | A | 8/1999 | Partlo et al. | 372/38 |
| 5,953,360 | A | 9/1999 | Vitruk et al. | 372/87 |
| 6,005,879 | A | 12/1999 | Sandstrom et al. | 372/25 |
| 6,016,325 | A | 1/2000 | Ness et al. | 372/38 |
| 6,018,537 | A | 1/2000 | Hofmann et al. | 372/25 |
| 6,028,880 | A | 2/2000 | Carlesi et al. | 372/58 |
| 6,034,978 | A | 3/2000 | Ujazdowski et al. | 372/34 |
| 6,051,841 | A | 4/2000 | Partlo | 250/504 R |
| 6,064,072 | A | 5/2000 | Partlo et al. | 250/504 R |
| 6,067,311 | A | 5/2000 | Morton et al. | 372/57 |
| 6,094,448 | A | 7/2000 | Fomenkov et al. | 372/102 |
| 6,104,735 | A | 8/2000 | Webb | 372/37 |
| 6,109,574 | A | 8/2000 | Pan et al. | 248/176.1 |
| 6,128,323 | A | 10/2000 | Myers et al. | 372/38 |
| 6,151,349 | A | 11/2000 | Gong et al. | 372/58 |
| 6,164,116 | A | 12/2000 | Rice et al. | 73/1.72 |
| 6,192,064 | B1 | 2/2001 | Algots et al. | 372/99 |
| 6,208,674 | B1 | 3/2001 | Webb et al. | 372/57 |
| 6,208,675 | B1 | 3/2001 | Webb | 372/58 |
| 6,212,211 | B1 | 4/2001 | Azzola et al. | 372/23 |
| 6,219,368 | B1 | 4/2001 | Govorkov | 372/59 |
| 6,240,117 | B1 | 5/2001 | Gong et al. | 372/58 |
| 6,317,447 | B1 | 11/2001 | Partlo et al. | 372/57 |
| 6,359,969 | B1 | 3/2002 | Shmaenok | 378/156 |
| 6,414,979 | B2 | 7/2002 | Ujazdowski et al. | 372/87 |
| 6,452,199 | B1 | 9/2002 | Partlo et al. | 250/504 R |
| 6,466,602 | B1 | 10/2002 | Fleurov et al. | 372/87 |
| 6,477,193 | B2 | 11/2002 | Oliver et al. | 372/58 |
| 6,493,374 | B1 | 12/2002 | Fomenkov et al. | 372/102 |
| 6,504,903 | B1* | 1/2003 | Kondo et al. | 378/119 |
| 6,541,786 | B1 | 4/2003 | Partlo et al. | 250/504 R |
| 6,549,551 | B2 | 4/2003 | Ness et al. | 372/38.07 |
| 6,556,612 | B2 | 4/2003 | Ershov et al. | 372/103 |
| 6,567,450 | B2 | 5/2003 | Myers et al. | 372/55 |
| 6,576,912 | B2 | 6/2003 | Visser et al. | 250/492.2 |
| 6,614,505 | B2 | 9/2003 | Koster et al. | 355/30 |
| 6,618,421 | B2 | 9/2003 | Das et al. | 372/55 |
| 6,625,191 | B2 | 9/2003 | Knowles et al. | 372/55 |
| 6,635,844 | B2 | 10/2003 | Yu | 219/121.68 |
| 6,693,939 | B2 | 2/2004 | Klene et al. | 372/58 |
| 6,782,031 | B1 | 8/2004 | Hofmann et al. | 372/90 |
| 6,815,700 | B2 | 11/2004 | Melnychuk et al. | 250/504 R |
| 6,928,093 | B2 | 8/2005 | Webb et al. | 372/25 |
| 6,972,421 | B2 | 12/2005 | Melnychuk et al. | 250/504 R |
| 6,987,279 | B2 | 1/2006 | Hoshino et al. | 250/504 R |
| 7,002,168 | B2 | 2/2006 | Jacob et al. | 250/504 R |
| 7,026,629 | B2 | 4/2006 | Bakker et al. | 250/423 P |
| 7,068,697 | B1 | 6/2006 | Amada et al. | 372/58 |
| 7,087,914 | B2 | 8/2006 | Akins et al. | 250/504 R |
| 7,135,693 | B2 | 11/2006 | Roux | 250/492.2 |
| 7,136,141 | B2 | 11/2006 | Bakker | 355/30 |
| 7,164,144 | B2 | 1/2007 | Partlo et al. | 250/504 R |
| 7,167,232 | B2* | 1/2007 | Banine et al. | 355/53 |
| 7,196,342 | B2 | 3/2007 | Ershov et al. | 250/504 R |
| 7,217,940 | B2 | 5/2007 | Partlo et al. | 250/504 R |
| 7,217,941 | B2 | 5/2007 | Rettig et al. | 250/504 R |
| 7,230,258 | B2 | 6/2007 | Ruzic et al. | 250/504 R |
| 7,251,012 | B2 | 7/2007 | Banine et al. | 355/30 |
| 7,271,401 | B2 | 9/2007 | Imai et al. | 250/504 R |
| 7,315,346 | B2 | 1/2008 | Van Beek et al. | 355/30 |
| 7,361,918 | B2 | 4/2008 | Akins et al. | 250/504 R |
| 7,365,349 | B2 | 4/2008 | Partlo et al. | 250/504 R |
| 7,365,350 | B2* | 4/2008 | Tran et al. | 250/504 R |
| 7,368,741 | B2 | 5/2008 | Melnychuk et al. | 250/504 R |
| 7,372,056 | B2 | 5/2008 | Bykanov et al. | 250/504 R |
| 7,378,673 | B2 | 5/2008 | Bykanov et al. | 250/503.1 |
| 7,394,083 | B2 | 7/2008 | Bowering et al. | 250/504 R |
| 7,405,416 | B2 | 7/2008 | Algots et al. | 250/493.1 |
| 7,415,056 | B2 | 8/2008 | Das et al. | 372/55 |
| 2004/0081615 | A1 | 4/2004 | Brinkley, III | 423/657 |
| 2005/0259709 | A1 | 11/2005 | Das et al. | 372/55 |
| 2006/0012761 | A1 | 1/2006 | Bakker et al. | 355/30 |
| 2006/0175558 | A1 | 2/2006 | Bakker et al. | 250/492.2 |
| 2006/0091109 | A1 | 5/2006 | Partlo et al. | 216/63 |
| 2006/0219957 | A1 | 10/2006 | Ershov et al. | 250/504 R |
| 2006/0243927 | A1 | 11/2006 | Tran et al. | 250/504 R |
| 2006/0249699 | A1 | 11/2006 | Bowering et al. | 250/504 R |
| 2006/0250500 | A1 | 11/2006 | Bakker et al. | 355/67 |
| 2006/0255298 | A1 | 11/2006 | Bykanov et al. | 250/504 R |
| 2006/0268246 | A1 | 11/2006 | Jacobs et al. | 355/30 |
| 2007/0001131 | A1 | 1/2007 | Ershov et al. | 250/503.1 |
| 2007/0102653 | A1 | 5/2007 | Bowering et al. | 250/504 R |
| 2007/0145297 | A1 | 6/2007 | Freriks et al. | 250/492.2 |
| 2007/0158594 | A1 | 7/2007 | Shirai et al. | 250/504 R |
| 2007/0228298 | A1 | 10/2007 | Komori et al. | 250/493.1 |
| 2007/0291279 | A1 | 12/2007 | Rafac | 356/508 |
| 2007/0291350 | A1 | 12/2007 | Ershov et al. | 359/333 |
| 2008/0043321 | A1 | 2/2008 | Bowering et al. | 359/359 |
| 2008/0048133 | A1 | 2/2008 | Bykanov et al. | 250/504 R |
| 2008/0087847 | A1 | 4/2008 | Bykanov et al. | 250/504 R |
| 2008/0149862 | A1 | 6/2008 | Hansson et al. | 250/504 R |

FOREIGN PATENT DOCUMENTS

| | | |
|---|---|---|
| EP | 1674932 A1 | 1/2008 |
| JP | 2006-329664 | 12/2006 |
| JP | 2007-220949 | 8/2007 |
| JP | 2007-317598 | 12/2007 |
| WO | WO 2005/015962 A2 | 2/2005 |

OTHER PUBLICATIONS

Harilal, et al., "Spectroscopic characterization of laser-induced tin plasma," J. of Appl. Phys. 98 (1), 013306, pp. 1-7, *Univ. of Calif. Postprints*, paper 857 (2005).

Harilal, et al., "Debris mitigation in a laser-produced tin plume using a magnetic field," J. of App. Phys., 98, 036102, pp. 1-3, *American Institute of Physics* (2005).

Harilal, et al., "Ambient gas effects on the dynamics of laser-produced tin plume expansion," J. of App. Physics, 99, 083303, pp. 1-10, *American Institute of Physics* (2006).

Hershcovitch, "High-pressure arcs as vacuum-atmosphere interface and plasma lens for nonvacuum electron beam welding machines, electron beam melting, and nonvacuum ion material modification," J. Appl. Phys. 78 (9), pp. 5283-5288, *American Institute of Physics* (1995).

Tao, et al., "Mitigation of fast ions from laser-produced Sn plasma for an extreme ultraviolet lithography source," in App. Physics Letters 89, 111502, *American Institute of Physics* (2006).

Tao, et al., "Characterizing and optimizing the density profile of double-pulse laser-produced Sn-based plasmas to enhance conversion efficiency and mitigate debris for an EUVL source," Center for Energy Research, Univ. of Calif., UCSD-CER-05-07 (2005).

Tao, et al., "A mass-limited Sn target irradiated by dual laser pulses for an extreme ultraviolet lithography source," in Optics Lett., Doc ID: 78008, pp. 1-12 (2007).

* cited by examiner

LASER PRODUCED PLASMA EUV LIGHT SOURCE

The present application claims priority to co-pending U.S. Patent Application Ser. No. 60/903,643 filed on Feb. 26, 2007, entitled EUV LIGHT SOURCE, the entire contents of which are hereby incorporated by reference herein.

The present application is a continuation-in-part application of co-pending U.S. patent application Ser. No. 11/107,535 filed on Apr. 14, 2005, entitled EXTREME ULTRAVIOLET LIGHT SOURCE, which is a continuation of U.S. patent application Ser. No. 10/409,254 filed on Apr. 8, 2003, entitled EXTREME ULTRAVIOLET LIGHT SOURCE, the entire contents of each of which are hereby incorporated by reference herein.

The present application is related to co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, co-pending U.S. patent application Ser. No. 11/174,443 filed on Jun. 29, 2005, entitled LPP EUV PLASMA SOURCE MATERIAL TARGET DELIVERY SYSTEM, co-pending U.S. SOURCE MATERIAL DISPENSER FOR EUV LIGHT SOURCE, co-pending U.S. patent application Ser. No. 11/358,992 filed on Feb. 21, 2006, entitled LASER PRODUCED PLASMA EUV LIGHT SOURCE, co-pending U.S. patent application Ser. No. 11/174,299 filed on Jun. 29, 2005, and entitled, LPP EUV LIGHT SOURCE DRIVE LASER SYSTEM, co-pending U.S. patent application Ser. No. 11/406,216 filed on Apr. 17, 2006 entitled ALTERNATIVE FUELS FOR EUV LIGHT SOURCE, co-pending U.S. patent application Ser. No. 11/580,414 filed on Oct. 13, 2006 entitled, DRIVE LASER DELIVERY SYSTEMS FOR EUV LIGHT SOURCE, and co-pending U.S. patent application Ser. No. 11/644,153 filed on Dec. 22, 2006 entitled, LASER PRODUCED PLASMA EUV IGHT SOURCE, co-pending U.S. patent application Ser. No. 11/505,177 filed on Aug. 16, 2006, entitled EUV OPTICS, co-pending U.S. patent application Ser. No. /452,501 filed on Jun. 14, 2006 entitled DRIVE LASER FOR EUV LIGHT SOURCE, co-pending U.S. Pat. No. 6,928,093, issued to Webb, et al. on Aug. 9, 2005, entitled LONG DELAY AND HIGH TIS PULSE STRETCHER, U.S. application Ser. No. 11/394,512, filed on Mar. 31, 2006 and titled CONFOCAL PULSE STRETCHER, U.S. application Ser. No. 11/138,001 filed on May 26, 2005 and titled SYSTEMS AND METHODS FOR IMPLEMENTING AN INTERACTION BETWEEN A LASER SHAPED AS A LINE BEAM AND A FILM DEPOSITED ON A SUBSTRATE, and U.S. application Ser. No. 10/141,216, filed on May 7, 2002, now U.S. Pat. No. 6,693,939, and titled, LASER LITHOGRAPHY LIGHT SOURCE WITH BEAM DELIVERY, U.S. Pat. No. 6,625,191 issued to Knowles et al on Sep. 23, 2003 entitled VERY NARROW BAND, TWO CHAMBER, HIGH REP RATE GAS DISCHARGE LASER SYSTEM, U.S. application Ser. No. 10/012,002, U.S. Pat. No. 6,549,551 issued to Ness et al on Apr. 15, 2003 entitled INJECTION SEEDED LASER WITH PRECISE TIMING CONTROL, U.S. application Ser. No. 09/848,043, and U.S. Pat. No. 6,567,450 issued to Myers et al on May 20, 2003 entitled VERY NAROW BAND, TWO CHAMBER, HIGH REP RATE GAS DISCHARGE LASER SYSTEM, U.S. application Ser. No. 09/943,343, co-pending U.S. patent application Ser. No, 11/509,925 filed on Aug. 25, 2006, entitled SOURCE MATERIAL COLLECTION UNIT FOR A LASER PRODUCED PLASMA EUV LIGHT SOURCE, the entire contents of each of which are hereby incorporated by reference herein.

FIELD

The present disclosure relates to extreme ultraviolet ("EUV") light sources which provide EUV light from a plasma that is created from a target material and collected and directed to an intermediate region for utilization outside of the EUV light source chamber, e.g. by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a target material, such as a droplet, stream or cluster of material having the required line-emitting element, with a laser beam.

One particular LPP technique involves irradiating a target material droplet with one or more pre-pulse(s) followed by a main pulse. In this regard, $CO_2$ lasers may present certain advantages as a drive laser producing "main" pulses in an LPP process. This may be especially true for certain target materials such as molten tin droplets. For example, one advantage may include the ability to produce a relatively high conversion efficiency e.g., the ratio of output EUV in-band power to drive laser input power.

In more theoretical terms, LPP light sources generate EUV radiation by depositing laser energy into a source element, such as xenon (Xe), tin (Sn) or lithium (Li), creating a highly ionized plasma with electron temperatures of several 10's of eV. The energetic radiation generated during de-excitation and recombination of these ions is emitted from the plasma in all directions. In one common arrangement, a near-normal-incidence mirror (often termed a "collector mirror") is positioned at a distance from the plasma to collect, direct (and in some arrangements, focus) the light to an intermediate location, e.g., focal point. The collected light may then be relayed from the intermediate location to a set of scanner optics and ultimately to a wafer. In a typical setup, the EUV light must travel within the light source about 1-2 m from the plasma to the intermediate location, and as a consequence, it may be advantageous, in certain circumstances, to use gases in the light source chamber that have a relatively low absorptance of in-band EUV light. In one configuration, the laser beam may be focused through a central opening of the collector mirror onto a droplet target for plasma generation. The EUV radiation emitted in the backwards direction is then reflected at near-normal incidence by the collector mirror and directed to the intermediate location. One advantage of this configuration is that a relatively large mass collector shell with a large thermal load capacity and low deformation potential can be employed that can be controlled by thermal management from the mirror's backside.

For the above-described configuration, a collector mirror having a graded high-temperature-stable coating with interface-engineered multi-layers is typically employed to provide relatively high EUV reflectivity at varying angles of incidence. These near-normal incidence (NI) collector mirrors tend to exhibit good thermal load capacity as well as good image fidelity under high heat load. The multi-layer (ML) coating may also provide substantial spectral filtering of out-of-band (OOB) EUV radiation. In addition, the ML coating can be stacked or the number of layer periods can be increased providing sacrificial layers that extend the useful lifetime of the NI collector.

For EUV light sources designed for use in high volume manufacturing (HVM) environments, the lifetime of the collector mirror is a critical parameter affecting efficiency, downtime, and ultimately, cost. During operation, debris are generated as a by-product of the plasma which can degrade the collector mirror surface. These debris can be in the form of high-energy ions, neutral atoms and clusters of target material. Of these three types of debris, the most hazardous for the collector mirror coating is typically the ion flux. Generally, for the configuration described above, the amount of neutral atoms and clusters from the droplet target impinging onto the collector may be small since most of the target material moves in a direction pointing away from the collector surface,(i.e., in the direction of the laser beam). In the absence of debris mitigation and/or collector cleaning techniques, the deposition of target materials and contaminants, as well as sputtering of the collector multilayer coating and implantation of incident particles can reduce the reflectivity of the mirror substantially.

In more detail, the interaction of ions with energies of around a few kilo-electron volts with the surface results in erosion of the material of the MLM coating. In one study, an erosion rate of ~0.2 layers per million pulses was observed. This layer removal can be attributed to sputtering during impact of energetic particles emitted from the plasma. As indicated above, the collector mirror coating can include sacrificial layers and still provide full EUV reflectivity. Assuming an erosion rate of 0.2 layers/Mpulses and 500 sacrificial layers, an unprotected collector would only be useful for about $2.2 \times 10^9$ Pulses, which corresponds to a lifetime of about 2 days in a HVM environment at a repetition rate of 50 kHz.

With the above in mind, Applicants disclose a Laser Produced Plasma EUV Light Source with Ion-stopping Buffer Gas, and corresponding methods of use.

SUMMARY

In one aspect, a device is disclosed which may comprise a system generating a plasma at a plasma site, the plasma producing EUV radiation and ions exiting the plasma. The device may also include an optic, e.g., a multi-layer mirror, distanced from the site by a distance, d, and a flowing gas disposed between the plasma and optic, the gas establishing a gas pressure sufficient to operate over the distance, d, to reduce ion energy below 100 eV, and in some cases below 30 eV, before the ions reach the optic. In one embodiment of this aspect, the gas may comprise hydrogen and in a particular embodiment, the gas may comprise greater than 50 percent hydrogen by volume. The gas may comprise deuterium. The plasma may comprise Sn. The laser may comprise a gain media and the gain media may comprise $CO_2$. Other materials for the gas, plasma and gain media may be suitably employed.

In one arrangement of this aspect, the system may comprise a droplet generator providing droplets and a laser illuminating droplets to create the plasma.

In one configuration of this aspect, the system may comprise a chamber, the optic and plasma may be disposed within the chamber, and the gas may be introduced into the chamber and exhausted therefrom during plasma generation. In a particular configuration, an on-demand hydrogen generation system and/or a source of diluting gas to mix with exhausted hydrogen prior to release may be used.

Operationally, for this aspect, the gas may comprises hydrogen and the pressure may be greater than 100 mTorr. For some implementations, a gas flow rate greater than 100 sccm may be used.

In one setup, for this aspect, the optic, e.g., collector mirror, may direct EUV light to an intermediate location and the device may further comprise a multi-channel pressure-reducing structure that may be disposed between the plasma and the intermediate location.

In another aspect, a device is disclosed which may comprise a system generating a plasma at a plasma site, the plasma producing EUV radiation and ions exiting the plasma, an optic that is distanced from the site by a distance, d, and a gas comprising a halogen, the gas disposed between the plasma and optic to establish a gas pressure sufficient to operate over the distance, d, to reduce ion energy below 100 eV, and in some cases below 30 eV, before the ions reach the optic. In one particular embodiment, the halogen may comprise bromine.

In another aspect, a device is disclosed which may comprise a system generating a plasma at a plasma site, the plasma producing EUV radiation and ions exiting the plasma, with the system comprising an irradiation source having a pulse shaper. For this aspect, the source may produce a pulse-shaped beam for irradiating a target material to produce a plasma having lower initial ion energies than a corresponding unshaped beam. For this aspect, the device may further comprise an optic distanced from the site by a distance, d; and a gas disposed between the plasma and optic, with the gas establishing a gas pressure sufficient to operate over the distance, d, to reduce ion energy below 100 eV, and in some cases below 30 eV, before the ions reach the optic.

In one implementation of this aspect, the pulse-shaped beam may comprise at least one pre-pulse and at least one main-pulse.

In particular embodiments of this aspect, the pulse shaper may comprise one or more of the following: a saturable absorber, an optical arrangement creating a laser spark, a pulse stretcher and a shutter operable to trim a pulse.

In another aspect, a device may comprise a laser source generating a laser beam, a source material irradiated by said laser beam at an irradiation zone to form a plasma and emit EUV light, a mirror reflecting EUV light to an intermediate region where the intermediate region is distanced from the irradiation zone by a distance, $D_1$. Also for this aspect, the device may comprise a receiving structure positioned to receive source material from the irradiation zone, the receiving structure formed with at least one passageway allowing EUV light to travel from the mirror to the intermediate region, the receiving structure distanced from the intermediate region by a distance, $D_2$, with $D_1 > D_2$.

In one embodiment of this aspect, the receiving structure may comprise a conical shaped shell and in a particular embodiment, the conical shaped shell may define an axis and the receiving structure may further comprise a plurality of radially oriented vanes and/or conical shells.

In one arrangement of this aspect, a temperature control system may be provided for the receiving structure and in a particular arrangement, the source material may comprise tin and at least a portion of the receiving structure may be maintained at a temperature above the melting point of tin.

In some embodiments of this aspect, the mirror may be distanced from the irradiation zone by a distance, d, and a flowing gas may be disposed between the irradiation zone and mirror, the gas establishing a gas pressure sufficient to operate over the distance, d, to reduce ion energy below 100 eV, and in some cases below 30 eV, before the ions reach the optic.

DETAILED DESCRIPTION

Figure 1:
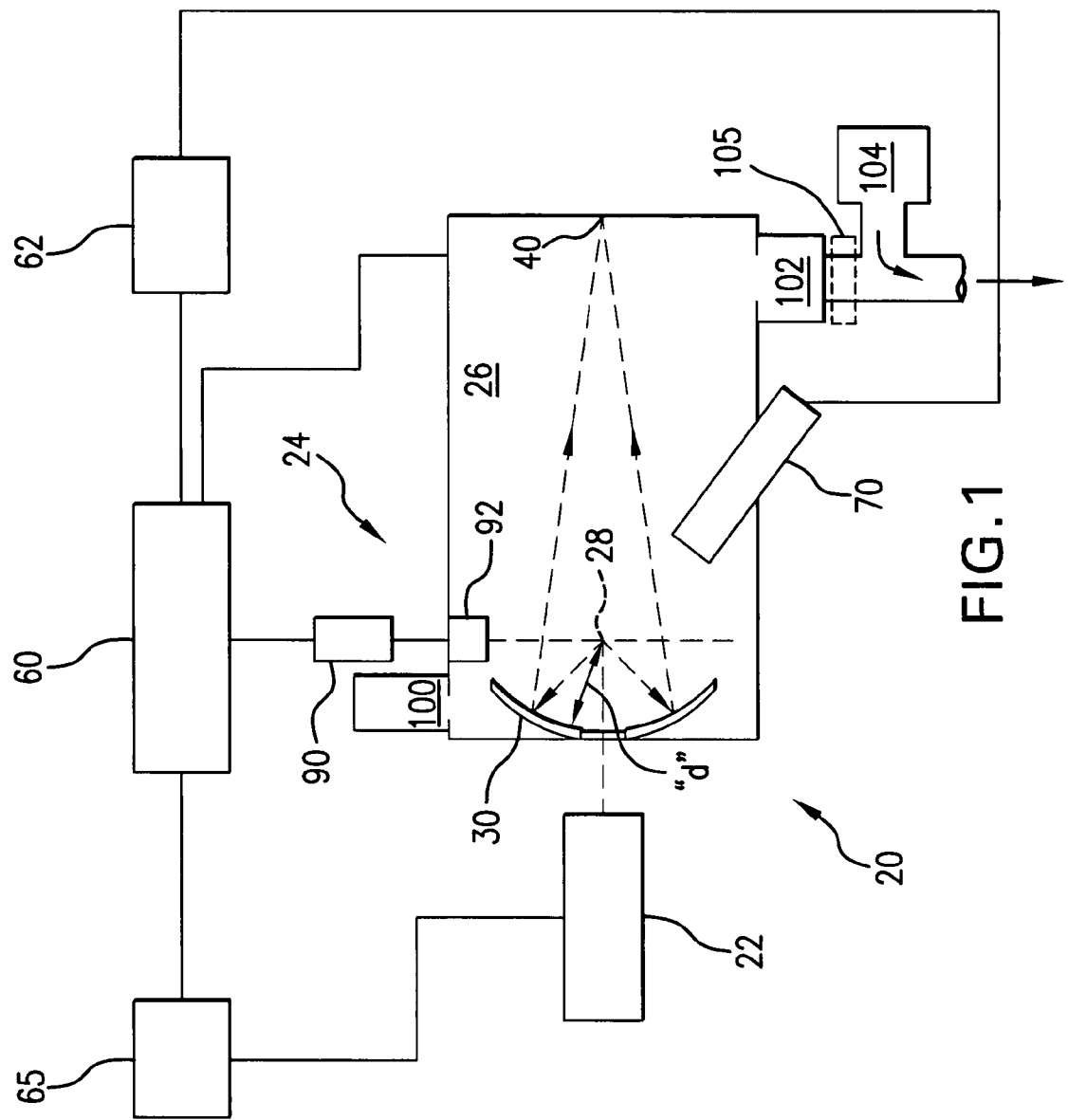
FIG. 1 shows a simplified, schematic view of a laser produced plasma EUV light source.

With initial reference to FIG. 1 there is shown a schematic view of an EUV light source, e.g., a laser produced plasma EUV light source 20 according to one aspect of an embodiment. As shown in FIG. 1, and described in further details below, the LPP light source 20 may include a system 22 for generating a train of light pulses and delivering the light pulses into a chamber 26. As detailed below, the light pulses may travel along one or more beam paths from the system 22 and into the chamber 26 to illuminate one or more targets at an irradiation region 28.

As further shown in FIG. 1, the EUV light source 20 may also include a target material delivery system 24, e.g., delivering droplets of a target material into the interior of a chamber 26 to the irradiation region 28 where the droplets will interact with one or more light pulses, e.g., one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets or any other form which delivers the EUV emitting element to the target volume in discrete amounts. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in co-pending U.S. patent application Ser. No. 11/406,216 filed on Apr. 17, 2006 entitled ALTERNATIVE FUELS FOR EUV LIGHT SOURCE, the contents of which have been previously incorporated by reference herein.

Continuing with FIG. 1, the EUV light source 20 may also include an optic 30, e.g., a collector mirror in the form of a truncated ellipsoid having, e.g., a graded multi-layer coating with alternating layers of Molybdenum and Silicon. FIG. 1 shows that the optic 30 may be formed with an aperture to allow the light pulses generated by the system 22 to pass through and reach the irradiation region 28. As shown, the optic 30 may be, e.g., an ellipsoidal mirror that has a first focus within or near the irradiation region 28 and a second focus at a so-called intermediate region 40 where the EUV light may be output from the EUV light source 20 and input to a device utilizing EUV light, e.g., an integrated circuit lithography tool (not shown). Also shown, the optic 30 is positioned such that the closest operable point on the optic 30 is located at a distance, d from the irradiation region 28. It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g. co-pending U.S. patent application Ser. No. 11/505,177 filed on Aug. 16, 2006-, entitled EUV OPTICS, the contents of which are hereby incorporated by reference.

As used herein, the term "optic" and its derivatives includes, but is not necessarily limited to, components which reflect and/or transmit and/or operate on incident light and includes, but is not limited to, lenses, windows, filters, wedges, prisms, grisms, gradings, etalons, diffusers, transmission fibers, detectors and other instrument components, apertures, stops and mirrors including multi-layer mirrors, near-normal incidence mirrors, grazing incidence mirrors, specular reflectors and diffuse reflectors. Moreover, as used herein, the term "optic" and its derivatives is not meant to be limited to components which operate solely or to advantage within one or more specific wavelength range(s) such as at the EUV output light wavelength, the irradiation laser wavelength, a wavelength suitable for metrology or some other wavelength.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 that provide an output indicative of the position of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 122 to control a source timing circuit and/or to control a beam position and shaping system, e.g., to change the location and/or focal power of the light pulses being delivered to the irradiation region 28 in the chamber 26.

As further shown in FIG. 1, the EUV light source 20 may include a droplet delivery control system 90, operable in response to a signal (which in some implementations may include the droplet error described above, or some quantity derived therefrom) from the controller 60, to e.g., modify the release point of the target material from a droplet delivery mechanism 92 to correct for errors in the droplets arriving at the desired irradiation region 28.

For the EUV light source 20, the droplet delivery mechanism 92 may include, for example, a droplet dispenser creating either 1) one or more streams of droplets exiting the dispenser or 2) one or more continuous streams which exit the dispenser and subsequently break into droplets due to surface tension. In either case, droplets may be generated and delivered to the irradiation region 28 such that one or more droplets may simultaneously reside in the irradiation region 28 allowing one or more droplets to be simultaneously irradiated by an initial pulse, e.g., pre-pulse to form an expanded target suitable for exposure to one or more subsequent laser pulse(s), e.g., main pulse(s), to generate an EUV emission. In one embodiment, a multi-orifice dispenser may be used to create a "showerhead-type" effect. In general, for the EUV light source 20, the droplet dispenser may be modulating or non-modulating and may include one or several orifice(s) through which target material is passed to create one or more droplet streams. More details regarding the dispensers described above and their relative advantages may be found in co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, and co-pending U.S. patent application Ser. No. 11/174,443 filed on Jun. 29, 2005, entitled LPP EUV PLASMA SOURCE MATERIAL TARGET DELIVERY SYSTEM, the contents of each of which are hereby incorporated by reference.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

As indicated above, irradiation of a target at the irradiation region 28 produces a plasma and generates an EUV emission. In addition, as a by-product of this process, ions may be generated which exit the plasma, typically, in all directions. Generally, the ion's initial energy exiting the plasma will vary over a range, with the range being affected by a number of factors including, but not limited to, the wavelength, energy, intensity and pulse-shape of the irradiating light, and the composition, size, shape and form of the target material. Also indicated above, these ions may, if unabated, degrade nearby optics, such as mirrors, laser input windows, metrology windows, filters, etc.

FIG. 1 shows that a flowing gas may be disposed between the plasma (irradiation region 28) and optic, the gas establishing a gas pressure sufficient to operate over the distance, d, to reduce ion energy to a target maximum energy level before the ions reach the optic. For example, a gas pressure sufficient to reduce ion energy to a target maximum energy level between about 10-200 ev, and in some cases below 30 eV may be provided. For operation of the device shown in FIG. 1, it is contemplated that the flowing gas establishing a target pressure over the distance, d, will be present during EUV light generation. Factors which may be considered in selecting a suitable gas composition and gas pressure include the ion stopping power of the gas composition (e.g. slowing ions below about 30 eV over a distance of about 20 cm) and the EUV absorption of the gas as a function of pressure (e.g. providing an acceptable in-band EUV absorption over a distance of 1-2 m as the EUV light travels from the plasma to the collector mirror and then on to the intermediate region 40.

Suitable gases may, depending on the specific application, include hydrogen e.g., greater than 50 percent hydrogen, deuterium, helium and combinations thereof. For example, for a plasma generating ions having a maximum initial ion energy and distance, d, of about 15 cm from the plasma, a suitable gas for reducing ion energy below about 30 eV may be hydrogen gas at a pressure of about 500 mtorr. SRIM (Stopping and Range of Ions in Matter) software (available at www-srim-org website) can be used to determine the gas pressure (operable over a given distance, d) that is required to reduce the energy of an ion (having an initial ion energy) to below a selected energy. From the pressure, the expected EUV absorption by the gas can be calculated. It is to be appreciated that gas introduced into the chamber may react with chamber conditions, ions and/or the plasma to dissociate and/or create ions, e.g. atomic hydrogen and/or hydrogen ions which may be effective for cleaning/etching and/or ion slowing.

FIG. 1 further shows that the light source 20 may include a regulated gas source 100 for introducing a gas into the chamber 26 and an adjustable pump 102 for removing gas from the chamber 26. With this arrangement, a flowing gas may be disposed between the optic 30 and irradiation region 28. Removal of gas from the chamber 26 may be performed to remove heat and thereby control the temperature within the chamber 26. to control the temperature of the optic 30 and/or to remove contaminants, vapor, metal dust, etc. from the chamber. These contaminants may degrade optical components and/or absorb EUV light. Control of the gas source 100 and pump 102 may be used to maintain a selected gas pressure and selected flow rate through the chamber 26. Typically, the selected flow rate will depend on the light source repetition rate and EUV output pulse energy. By way of example, for a Sn target and $CO_2$ laser system with the optic 30 position 15 cm from the irradiation site 28, a laser pulse energy of about 500 mJ and an EUV output repetition rate in the range of 10-100 kHz, a flow rate of about 100 sccm or greater, may be employed.

For the light source 20, the gas source 100 may introduce several gases, for example $H_2$, He, Ar and HBr, either separately or the gas may be introduced as a mixture. Moreover, although FIG. 1 illustrates that gas being introduced at one location, it is to be appreciated that the gas may be introduced at multiple locations and may be removed at multiple locations. The gas may be supplied via a tank or may be generated locally. For example, the gas source 100 may include an on-demand hydrogen/deuterium generator. Several types are available including a device with extracts hydrogen/deuterium from water/heavy water using a proton exchange membrane. Such a device is marketed and sold by Domnick Hunter under the product name Hydrogen Generator, for example see the www-domnickhunter-com website for details.

Depending on the gas used, a source 104 of a diluent gas may be used to dilute the exiting gas prior to release into the atmosphere. For example, when $H_2$ is used (which tends to be explosive at concentrations of 4-25%), a diluent gas such as when $N_2$ may be used to reduce the $H_2$ concentration before release (generally below 4% and more preferably below 0.4%). Alternatively, or in addition to the use of a diluent gas, a catalytic converter, possibly having a Platinum catalyst may be used to convert hydrogen to water.

Suitable gases for reducing ion energy may include, but are not limited to, hydrogen (protium and deuterium isotopes) helium and combinations thereof. In addition, a cleaning/etching gas for removing contaminants that have deposited on surfaces of optics may be included such as a gas having a halogen. For example, the etchant gas may include HBr, HI, $Br_2$, $Cl_2$, HCl, or combinations thereof. By way of example, a suitable composition when Sn or a Sn compound is used as the target material may include 50-99% $H_2$ and 1-50% HBr. A scrubber 105 may be provided to remove some or all of the etchant gas vapors, as shown in FIG. 1.

Figure 2A:
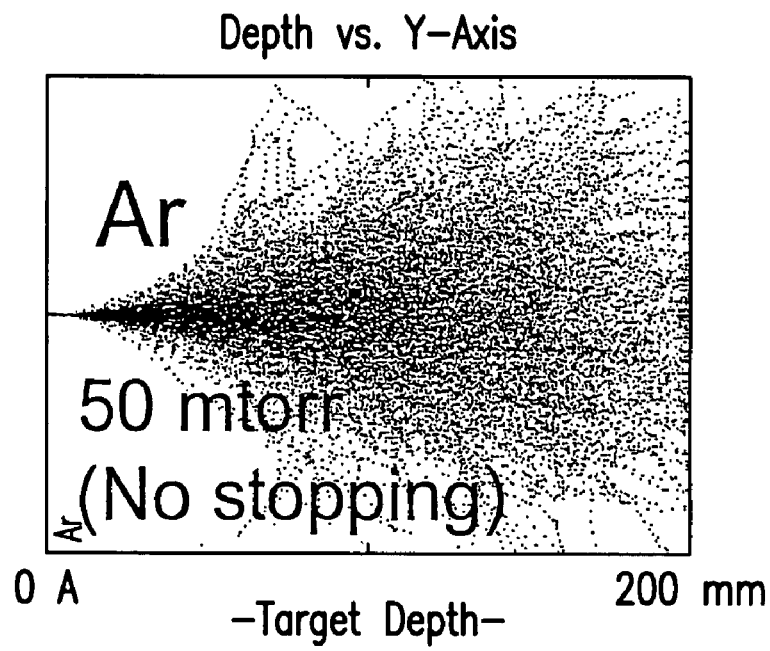
FIG. 2A shows a calculated plot using SRIM software illustrating that ions are significantly scattered but are not stopped in Argon gas at 50 mTorr over a distance, d, of 200 mm.
Figure 2B:
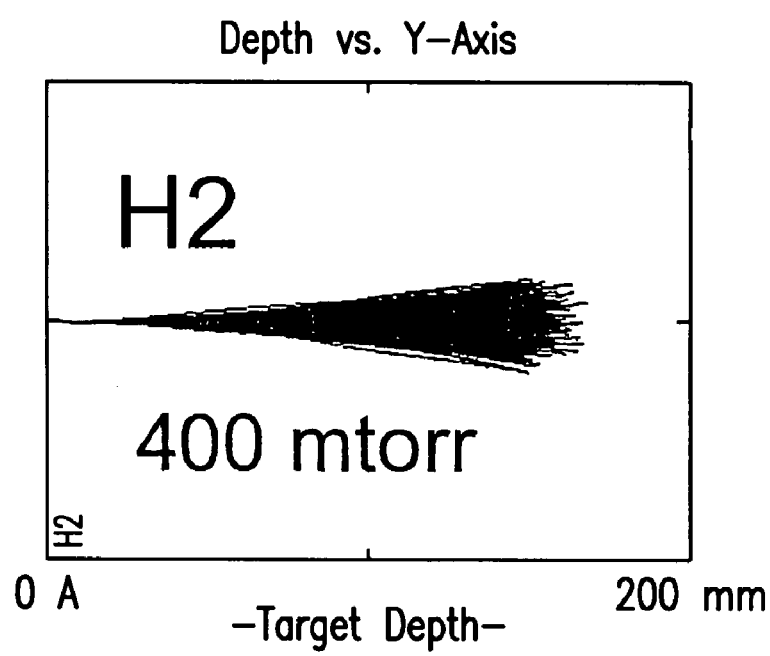
FIG. 2B shows a calculated plot using SRIM software illustrating that ions have less scattering (compared to FIG. 2A) and may be effectively stopped in Hydrogen gas at 400 mTorr at a distance, d, of about 170 mm.

FIG. 2A shows a calculated plot using SRIM software illustrating that ions having an initial energy of 10 keV are significantly scattered but are not stopped in. Argon gas at 50 mTorr over a, distance, d, of 200 mm. On the other hand, FIG. 2B shows a calculated plot using SRIM software illustrating that ions having an initial energy of 10 keV have less scattering (compared to FIG. 2A) and may be effectively stopped in Hydrogen gas at 400 mTorr at a distance, d, of about 170 mm.

Figure 3:
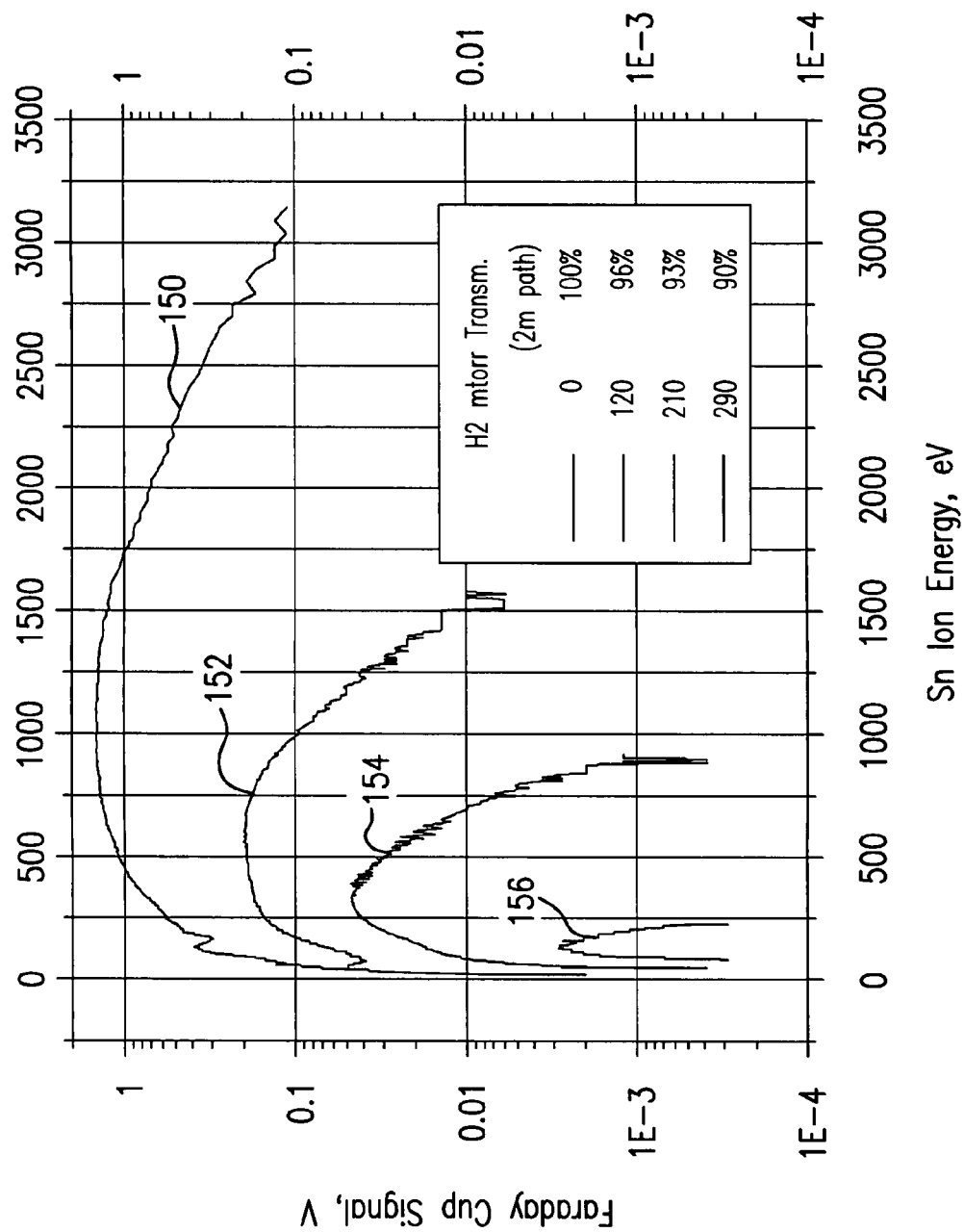
FIG. 3 shows measured plots illustrating ion stopping at three different hydrogen pressures at a distance of 16.5 cm from the plasma.

FIG. 3 shows measured plots illustrating ion stopping at three different hydrogen pressures. As shown, in the absence of or any other stopping gas hydrogen, the distribution of ion energies is represented by curve 150 which shows that the maximum initial ion energy is about 3 keV. These ions where generated by irradiating a flat Sn target with $CO_2$ laser pulse at optimal intensity for in-band conversion (e.g. CE~4.5%). Measurements were conducted using a Faraday Cup (Model FC-73A from Kimball Physics) positioned about 16.5 cm from the irradiation zone and positioned to receive ions at an angle of about 45 degrees from the input laser beam axis. Curve 152 shows that for ions having an initial maximum ion energy of about 3 keV, maximum ion energy is reduced to about 1.5 keV over a distance, d, of 16.5cm in uniform, non-flowing Hydrogen gas at 120 mTorr. Curve 154 shows that for ions having an initial maximum ion energy of about 3 keV, maximum ion energy is reduced to about 0.9 keV over a distance, d, of 16.5 cm in uniform, non-flowing Hydrogen gas at 210 mTorr. Curve 156 shows that for ions having an initial maximum ion energy of about 3 keV, maximum ion energy is reduced to about 0.25 keV over a distance, d, of 16.5 cm in uniform, non-flowing Hydrogen gas at 290 mTorr. FIG. 3 also shows calculated EUV transmissions over a 2 m path for the three hydrogen pressures, with Hydrogen gas at 120 mTorr having 96% transmission, Hydrogen gas at 210 mTorr having 93% transmission, and Hydrogen gas at 290 mTorr having 90% transmission.

Figure 4A:
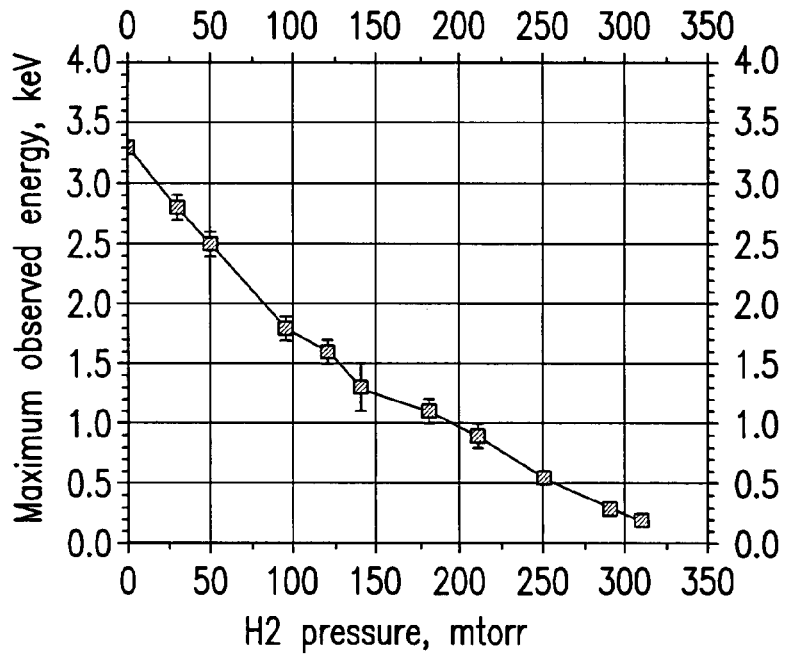
FIG. 4A shows a plot of maximum observed energy at a distance of 16.5 cm from the plasma versus hydrogen pressure for ions having initial ion energies as shown in curve 150 of FIG. 3.
Figure 4B:
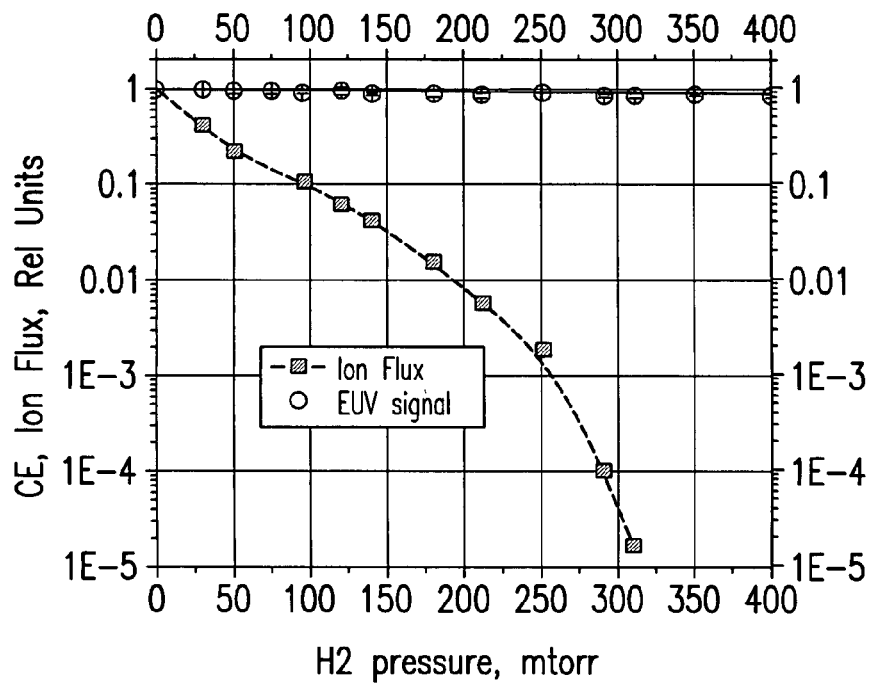
FIG. 4B shows in-band EUV signal after passing through a distance d, of 145 cm as a function of Hydrogen pressure; and ion flux as a function of Hydrogen pressure with ion flux calculated as $\int I(E)dE$ at a distance of 16.5 cm from the plasma.
Figure 4C:
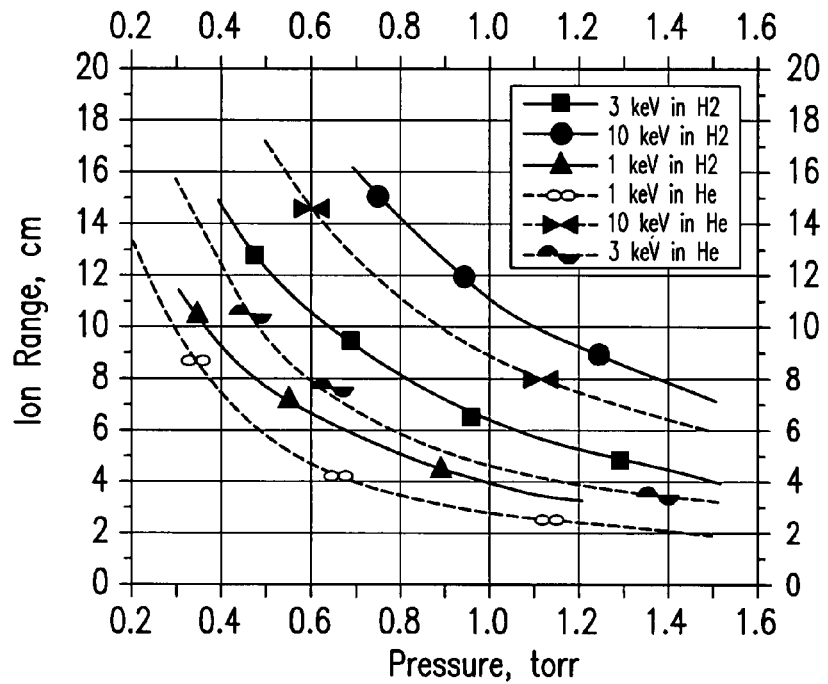
FIG. 4C shows plots of ion range (in cm) as function of gas pressure (for Hydrogen and Helium gases) for various initial ion energies as calculated using SRIM simulation software.

FIG. 4A shows a plot of maximum observed energy versus hydrogen pressure for ions having initial ion energies as shown in curve 150 of FIG. 3 using a Faraday Cup positioned 16.5 cm from the irradiation zone and at an angle of about 45 degrees from the input laser beam axis. FIG. 4B shows measured normalized in-band EUV signal after passing through a distance of 145 cm as a function of Hydrogen pressure; and ion flux as a function of Hydrogen pressure with ion flux calculated as $\int I(E)dE$. FIG. 4C shows a plot. of ion range (in cm) as function of gas pressure for various initial ion energies and for Hydrogen and Helium gases as calculated using SRIM simulation software (as described above).

The above data demonstrate an ion mitigation technique which may be used to suppress ion flux (i.e., the energy-integrated signal) by about 4 orders of magnitude with an acceptable level of EUV absorption. As indicated above, collector mirror coating may have at least about 500 sacrificial layers and still provide full EUV reflectivity. Taking into account the measured erosion rate of 0.2 layers per Million pulses (in the absence of ion mitigation) and the suppression factor of $10^4$ (due to the above-described mitigation), a collector lifetime exceeding $10^{12}$ pulses is estimated corresponding to about 1 year of operation of the collector mirror in a high volume manufacturing environment.

Figure 4D:
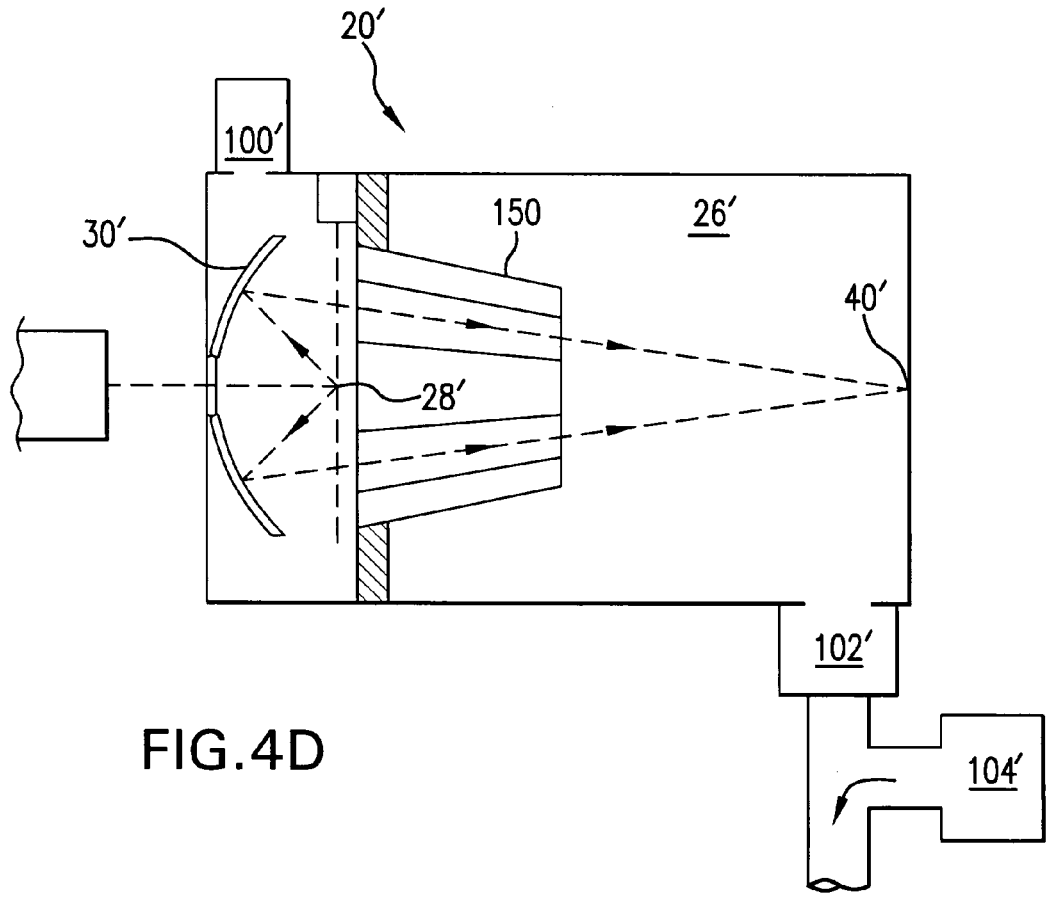
FIG. 4D shows a light source having a pressure reducing structure to reduce pressure in portions of the chamber and thereby reduce absorption of EUV light by the gas in the pressure reduced portions.

FIG. 4D shows a light source 20' which may include a regulated gas source 100' for introducing a gas into the chamber 26' and an adjustable pump 102' for removing gas from the chamber 26' (with diluent gas 104', if necessary). For the source 20' the gas may establish a gas pressure sufficient to operate over the distance, d, (shown in FIG. 1) to reduce ion energy to a target maximum energy level before the ions reach the optic 30'. For the arrangement shown in FIG. 4D, a pressure reducing structure 150 may be provided to reduce pressure in portions of the chamber 26' (e.g. between the structure 150 and intermediate region 40') and thereby reduce absorption of EUV light by the gas. As shown, the pressure reducing structure 150 may be disposed between the irradiation location 28 and the intermediate point 40' and may include multi-channel structure having a plurality of radial and/or concentric, conical shaped vanes that are arranged to allow light to travel from the optic 30' to the intermediate point 40' and minimize EUV light obscuration. At the same time, the structure 150 may provide significant resistance to gas flow, thus, the ion slowing gas pressure may be localized to the volume between the structure 150 and optic 30'.

Pulse Shaping

Figure 5A:
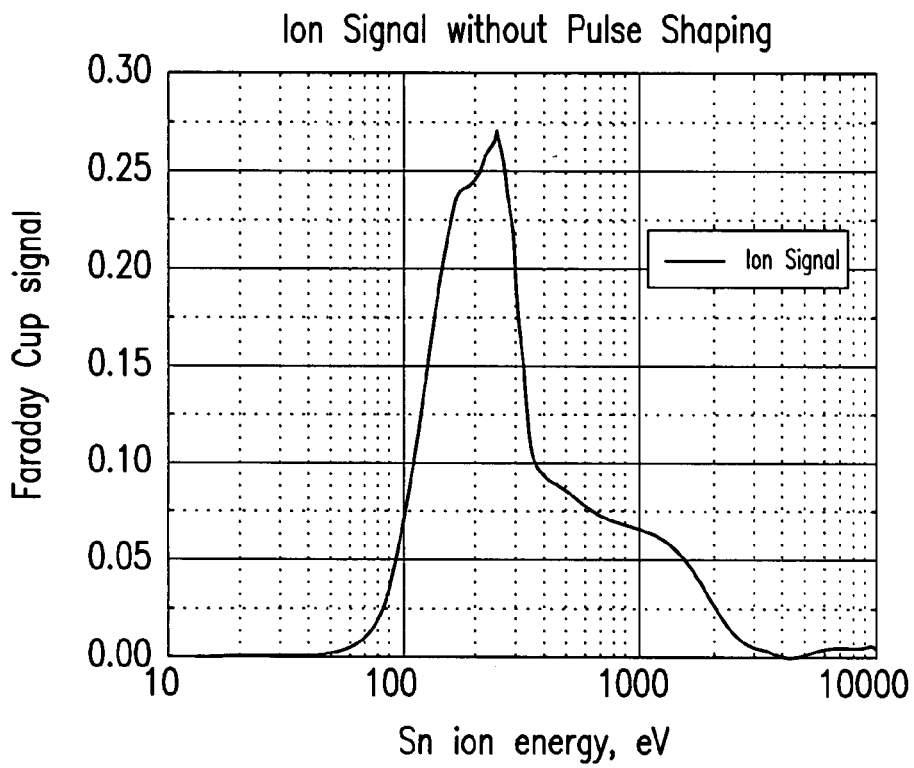
FIG. 5A shows the ion signal for a drive laser pulse that was not pulse shaped.
Figure 5B:
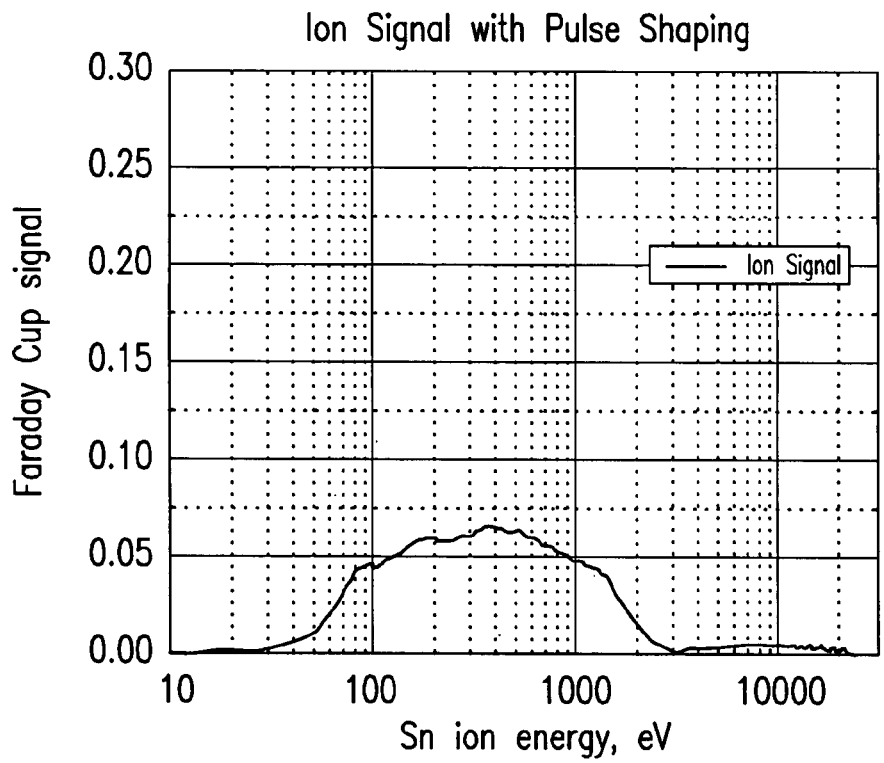
FIG. 5B shows the ion signal for a drive laser pulse that was pulse shaped by trimming a trailing edge of a pulse.
Figure 5C:
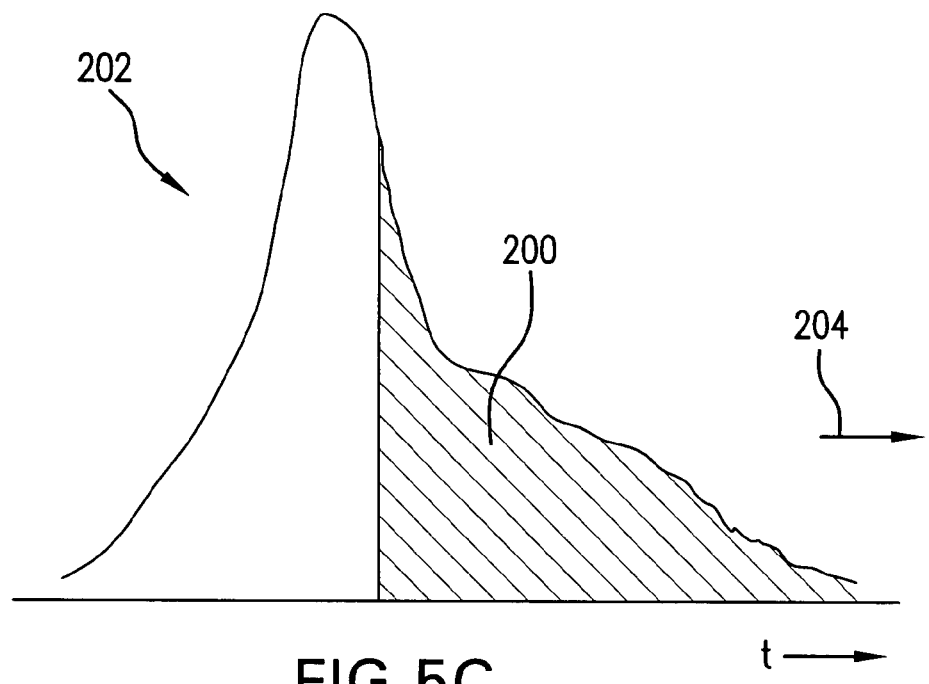
FIG. 5C shows a pulse and indicates a portion of the pulse, a trail edge portion which may be trimmed to reduce ion flux.

FIGS. 5A-B illustrate that ion flux may be reduced by irradiating targets with a pulse-shaped beam. The use of pulse shaping to reduce ion flux may, depending on the specific application, be used alone or in combination with one or more other ion mitigation techniques such as the use of an ion slowing gas as described above, the use of a foil shield (with or without a slowing or deflecting gas), and the use of an electric and/or magnetic field(s) to deflect or slow ions. FIG. 5A shows the ion signal for an unshaped pulse and FIG. 5B shows the ion signal for a drive laser pulse that was pulse shaped by trimming a trailing edge of a pulse. FIG. 5C illustrates pulse trimming graphically. As seen there, a trail edge portion 200 of the pulse 202 waveform may be trimmed using one of the techniques described below to produce a shaped pulse which subsequently irradiates a target to produce an EUV emission and reduce ion flux. Although FIG. 5C illustrates the trimming of a trailing edge, it is to be appreciated that the leading edge may also be trimmed to produce a shaped pulse which subsequently irradiates a target to produce an EUV emission and reduce ion flux.

Figure 6:
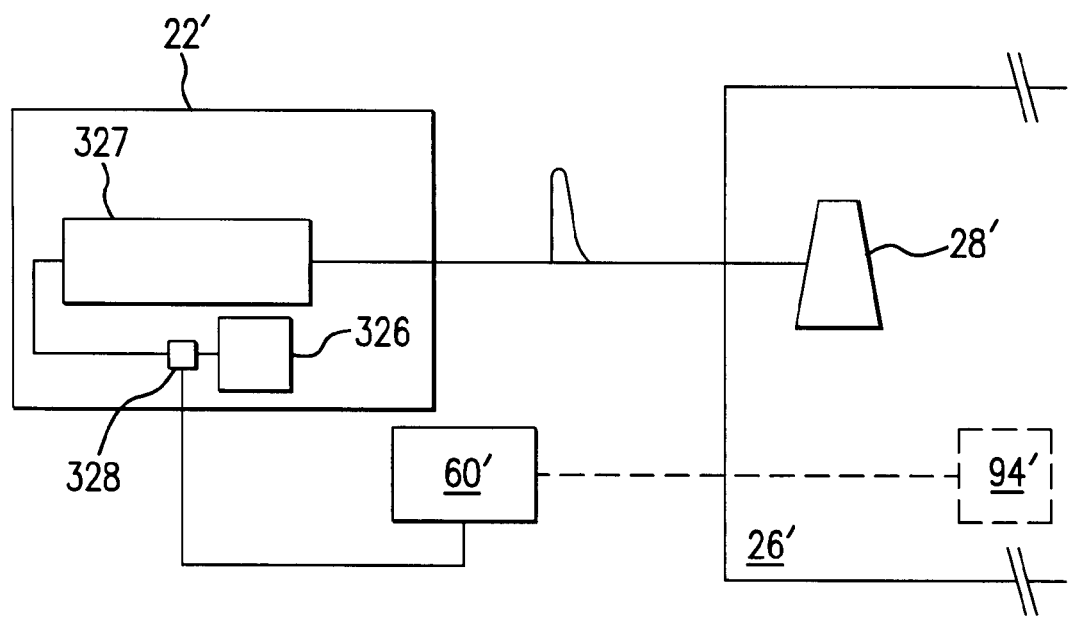
FIG. 6 shows an arrangement for producing a shaped pulse via pulse trimming.

FIG. 6 shows an arrangement which may be employed to produce a pulse-shaped beam via pulse trimming resulting in a reduced ion flux. As shown there, a system 22' for generating light pulses and delivering the light pulses into a chamber 26'. may include a device 326, e.g., oscillator generating laser pulses, e.g., main pulses, with each pulse having a pulse duration, and an amplifier 327 having one or more amplifying chambers. Note: for some embodiments the device 326 may also provide pre-pulses or a separate device (not shown) may be included to provide pre-pulses As shown, the system 22' may also include a shutter 328 operable to alter, e.g., trim, a pulse such that only a temporal portion of the original pulse is delivered to the irradiation region 28' to illuminate the target material.

FIG. 6 also shows that the arrangement may include an optional measuring instrument 94' such as a Faraday cup or other ion energy meter for use in a control loop, e.g., feedback loop to verify or control pulse trimming (note: instrument 94' and its connection shown in dashed lines to indicate that it is an optional component). Alternatively, the pulse trimming may be controlled open loop (i.e. may be uncontrolled, e.g., constant pulse trimming may be employed) and thus, a measuring instrument may not be required for these implementations. For the optional arrangement shown, a controller 60' may receive a signal, e.g., a feedback signal, e.g., a signal indicative of ion energy, ion flux or maximum ion energy, from the measuring instrument 94' and in turn, communicate with the shutter 328.

For the EUV light source shown in FIG. 6, the shutter 328 (shown schematically) may include an electro-optic switch, e.g., having a time response in the nanosecond range, e.g., Pockel's or Kerr cell, and a polarizer. For example, the device 326, e.g., $CO_2$ laser device, may employ polarizer(s) and/or Brewster's windows such that light exiting the device 326 has a primary polarization direction. With this arrangement, the shutter may include an electro-optic switch and a polarizer having a transmission axis aligned orthogonal to the primary polarization direction defined by the device 326. Thus, when the switch is energized, light is able to pass from the device 326 to the irradiation region 28'. On the other hand, when the switch is de-energized, the polarization of light exiting the device 326 is rotated and is absorbed and/or reflected (away from the beam path leading to the irradiation region 28') by the polarizer. One feature of the arrangement shown in FIG. 6 is that the shutter 328 may be positioned upstream of the amplifier 327 which may be beneficial in some applications due to the relatively low laser light intensity at the shutter 328.

Suitable lasers for use as the device 22' shown in FIG. 6 may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and focused before entering the LPP chamber. Continuously pumped $CO_2$ amplifiers may be used for the system 22'. For example, a suitable $CO_2$ laser device having an oscillator and three amplifiers (O-PA1-PA2-PA3 configuration) is disclosed in co-pending U.S. patent application Ser. No. 11/174,299 filed on Jun. 29, 2005, and entitled, LPP EUV LIGHT SOURCE DRIVE LASER SYSTEM, the entire contents of which have been previously incorporated by reference herein.

Depending on the application, other types of lasers may also be suitable, e.g., an excimer or molecular fluorine laser operating at high power and high pulse repetition rate. Examples include, a solid state laser, e.g., having a fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

Figure 7:
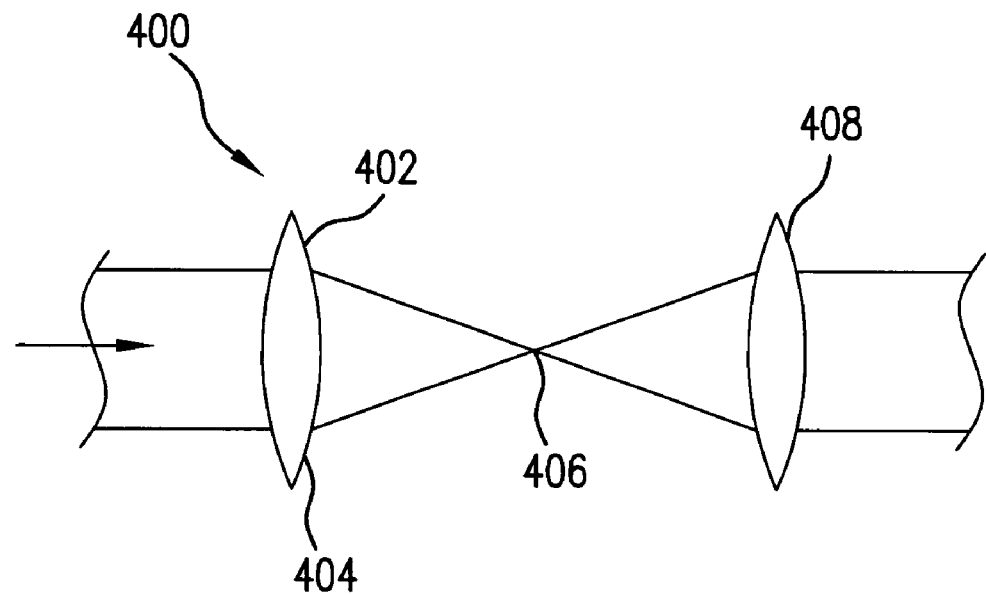
FIG. 7 shows an optical arrangement 400 for pulse trimming using laser sparking.

FIG. 7 shows an optical arrangement 400 for pulse trimming having a first optic 402 focusing a pulses light beam 404 to a focal spot 406 in a gas environment, e.g. air, such that light above a pre-selected intensity sparks at the focal spot 406 and therefore does not reach collimating optic 408. For the arrangement shown, a confocal lens pair is used to focus and collimate, however, it is to be appreciated that other optical arrangements may be suitable. This technique allows for trimming a portion of a pulse which includes a pulse peak, or the technique may be configured to trim a pulse portion which does not include the pulse peak.

Figure 7A:
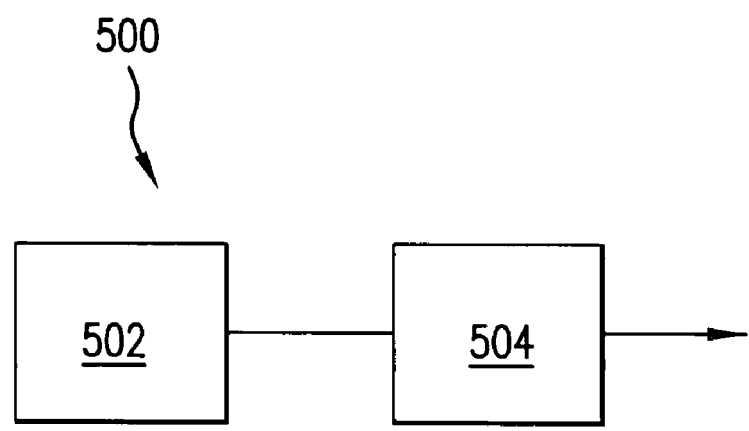
FIG. 7A shows an optical arrangement 400 for pulse trimming using a saturable absorber material.

FIG. 7A shows another optical arrangement 500 for pulse trimming in which a pulse train from a source 502 is passed through an appropriate saturable absorber material cell 504. For example, a suitable saturable absorber material for 10.6 µm laser light from a $CO_2$ laser may be $SF_6$ gas. Optionally, an optical arrangement such as the confocal lens pair shown in FIG. 7 may be used to optimize intensity in the saturable absorber material cell 504.

It is to be appreciated that the arrangements 400, 500 may each employ a flowing gas, especially at high EUV light source repetition rates, to refresh the gas (sparking gas or saturable absorber gas) after each pulse. Moreover, for drive lasers having multiple amplifiers, the arrangements 400, 500 may be position prior to the first amplifier, between amplifiers or downstream of the amplifier chain.

Figure 8:
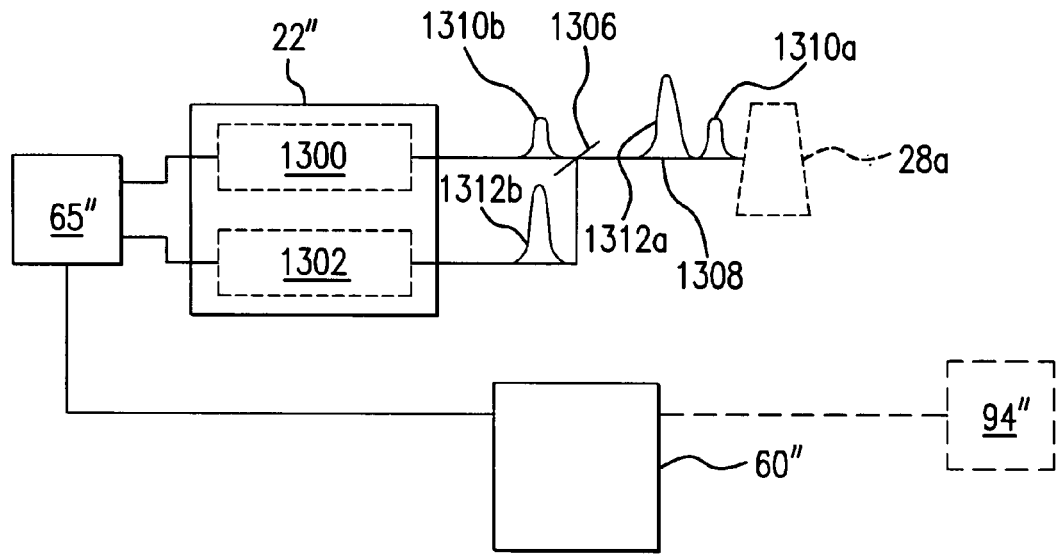
FIG. 8 shows an arrangement for producing a shaped pulse via pre-pulsing.

FIG. 8 shows an arrangement which may be employed to produce a pulse-shaped beam via pre-pulsing resulting in a reduce ion flux. As used herein, the term pulse-shaped beam includes, but is not necessarily limited to, trimmed pulses (as described above) and pre-pulse, main pulse sequences in which a target is irradiated by one or more pre-pulses and thereafter one or more main pulses. For use herein, the pre-pulse(s) and main pulse(s) may originated from a common laser or different laser(s), and in some cases, the pre-pulse and main pulse may constitute difference peaks of a single pulse that has be operated on, for example using a delay path.

As shown in FIG. 8 the system 22" may include two separate devices 1300, 1302 that are used to generate the pre-pulse(s) and main pulse(s), respectively. FIG. 8 also shows that a beam combiner 1306 may be employed to combine pulses from the devices 1300, 1302 along a common beam path 1308. Device 1300 may be a lamp, e.g., producing incoherent light, or a laser. Suitable lasers for use as the device 1300 may include pulsed gas discharge lasers such as excimer, $CO_2$, etc, pulsed solid state lasers, e.g., disk shaped Nd:YAG, etc. Light device 1302 is typically a laser (as described above) and may be a different type of laser than used for device 1300.

As further illustrated by FIG. 8, the device 1300 generates a train of pre-pulses 1310a,b that are delivered to an irradiation region 28a. At the target volume, each pre-pulse may irradiate at least one droplet(s) to produce an expanded target. Also, device 1302 generates a train of main pulses 1312a,b with each main pulse for irradiating a respective expanded target at or near the irradiation region 28a to produce an EUV light output.

In some, but not all arrangements, ion energy can then be measured by the instrument 94" (shown as optional in dashed lines) and used in a feedback control loop to control one or more pre-pulse parameters to alter the shape of a subsequent "shaped pulse" (i.e. as an alternative to using a constant non-altering pulse shape). For this optional arrangement, as shown in FIG. 8, the controller 60" may receive a signal, e.g., a feedback signal, e.g., a signal indicative of ion energy, ion spectrum or the like, from the instrument 94" and in turn, communicate with firing control system 65" to independently trigger one or both of the devices 1300, 1302 and/or control the discharge voltage of the device 1300. Although the controller 60" and firing control system 65" are shown as discrete elements, it is to be appreciated that the controller 60" and firing control system 65" may be integrated into a common unit and/or may share one or more processors, memory boards, etc. For example, the pre-pulse parameter may be a delay time, Δt, between a pre-pulse 1310a and a corresponding main pulse 1312a. This may be accomplished by controlling the triggering times for the devices 1300, 1302. Alternatively, or in addition thereto, the pulse energy of the pre-pulse may be varied to control the pulse shape.

Figure 9:
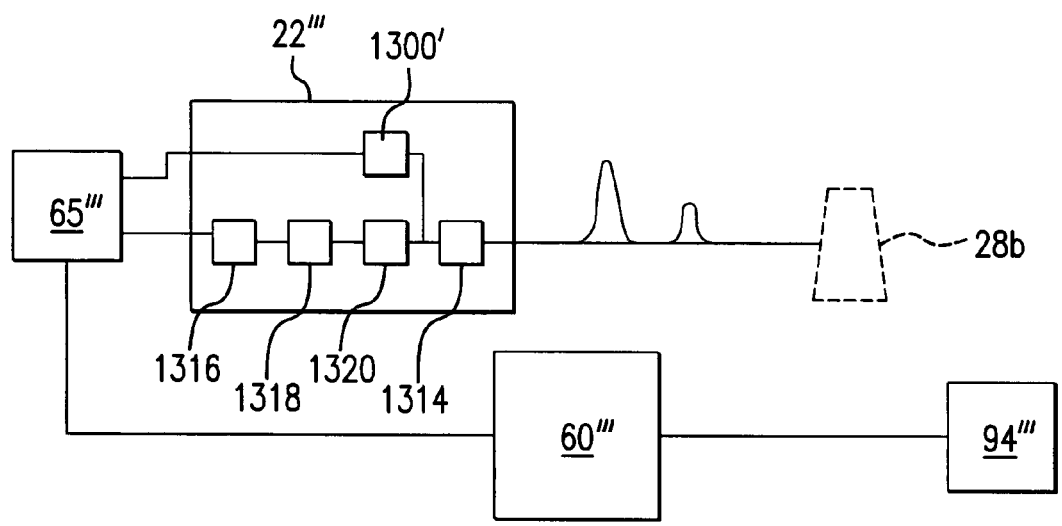
FIG. 9 shows an arrangement for producing a shaped pulse via pre-pulsing in which the pre-pulse and main pulse both pass through a common amplifier.

FIG. 9 shows another embodiment having a system 22''' in which the source producing a train of pre-pulses and the source producing a train of main pulses may pass through a common pulse amplifier 1314. For this setup, the main pulses may be generated using a four chamber O-PA1-PA2-PA3 architecture as shown and designated 1316 (oscillator), 1318 (PA1), 1320 (PA2), 1314 (PA3). Pulses generated by the laser device 1300' may pass through the PA 1314 for amplification, prior to delivery to the irradiation region 28b, as shown. Although three amplifiers are shown in FIG. 9, it is to be appreciated that more than three and as few as one amplifier may be specified for the system 22'''. As an alternative to using constant, non-altering pulse shape, an optional controller 60''' may receive a signal, e.g., a feedback signal, e.g., a signal indicative of ion energy, spectrum or the like, from the measuring instrument 94''' and in turn, communicate with firing control system 65''' to independently trigger the device 1300''' and/or the oscillator 1316 and/or control the pulse shape generated by the device 22'''. In this manner, a pre-pulse parameter, e.g., a delay time between a pre-pulse and a corresponding main pulse and/or the pulse energy of the pre-pulse, may be varied to control pulse shape.

Figure 10:
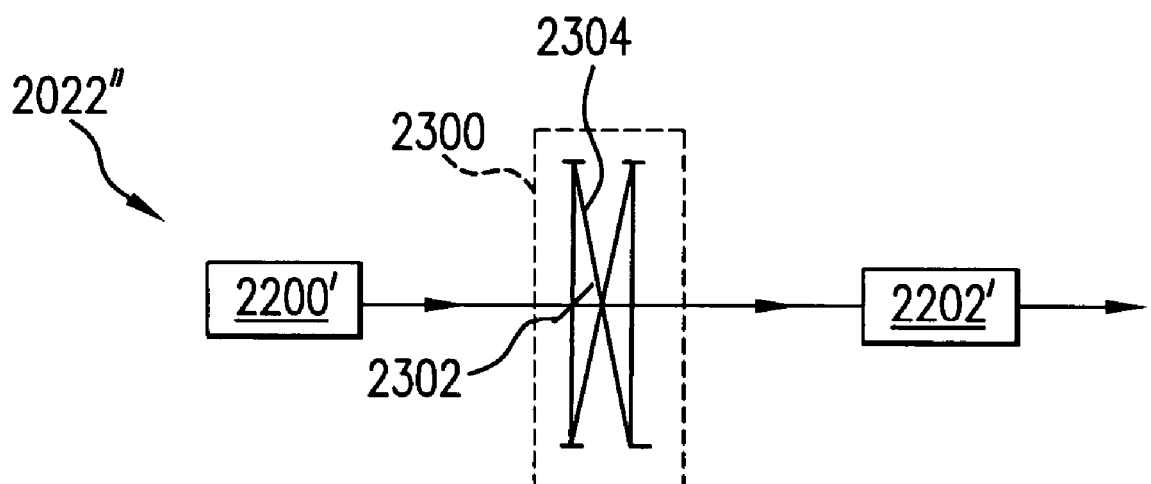
FIG. 10 illustrates another embodiment of a laser source which includes an oscillator unit, a temporal pulse stretcher and an amplification unit.

FIG. 10 illustrates an arrangement in which a pulse stretcher 2300 may be employed to produce a shaped pulse to reduce ion flux. As shown there, a source 2022' may include an oscillator unit 2201', a temporal pulse stretcher/multiplier 2300 and an amplification unit 2202'. Although FIG. 10 shows the pulse stretcher 2300 positioned between an oscillator unit 2200' and an amplification unit 2202', it is to be appreciated that the pulse stretcher 2300 may be positioned downstream of an amplification unit (although it may see higher optical power), or may be used with a single chamber laser to produce "shaped pulses". More details regarding temporal pulse stretchers may be found in U.S. Pat. No. 6,928,093, issued to Webb, et al. on Aug. 9, 2005, entitled LONG DELAY AND HIGH TIS PULSE STRECTCHER, U.S. application Ser. No. 11/394,512, filed on Mar. 31, 2006 and titled "CONFOCAL PULSE STRECTCHER", U.S. application Ser. No. 11/138,001 filed on May 26, 2005 and titled "SYSTEMS AND METHODS FOR IMPLEMENTING AN INTERACTION BETWEEN A LASER SHAPED AS A LINE BEAM AND A FILM DEPOSITED ON A SUBSTRATE", and U.S. application Ser. No. 10/141,216, filed on May 7, 2002, now U.S. Pat. No. 6,693,939, and titled, "LASER LITHOGRAPHY LIGHT SOURCE WITH BEAM DELIVERY," the disclosures of each of which are hereby incorporated by reference herein.

Typically, these optical pulse stretchers/multipliers include a beam splitter 2302 which passes a portion of the beam along a delay path 2304 allowing the pulse shape exiting the stretcher to be controlled by selecting the proper beam splitter reflectivity and delay path length. Specifically, the pulse stretcher 2300 receives an input pulse generally having a single peak (i.e., in a plot of intensity vs. time) and outputs a pulse having a plurality of temporally spaced peaks. As shown, the stretcher 2300 may be substantially lossless.

For the stretcher 2300 shown, the reflectivity of the beam splitter 2302 will impact the relative magnitude of the output peaks and the length of the delay path may establish the temporal separation between peaks. Thus, the output pulse shape can be engineered by proper selection of the beam splitter reflectivity and the length of the delay path.

Figure 10A:
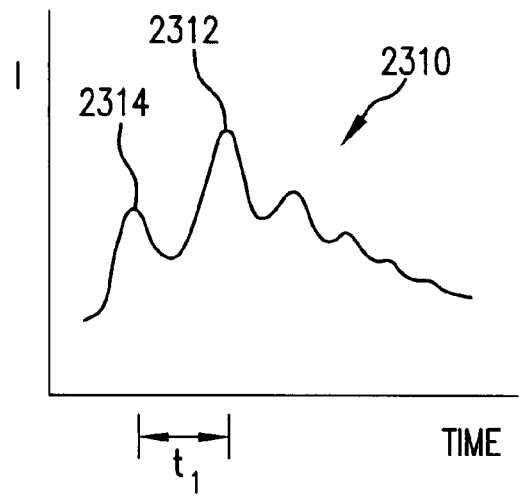
FIG. 10A illustrates a first pulse shape that may be obtained using a pulse stretcher.
Figure 10B:
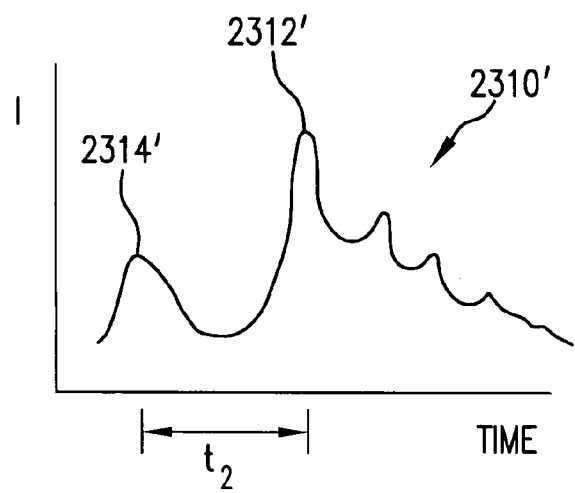
FIG. 10B illustrates another pulse shape that may be obtained using a pulse stretcher.
Figure 10C:
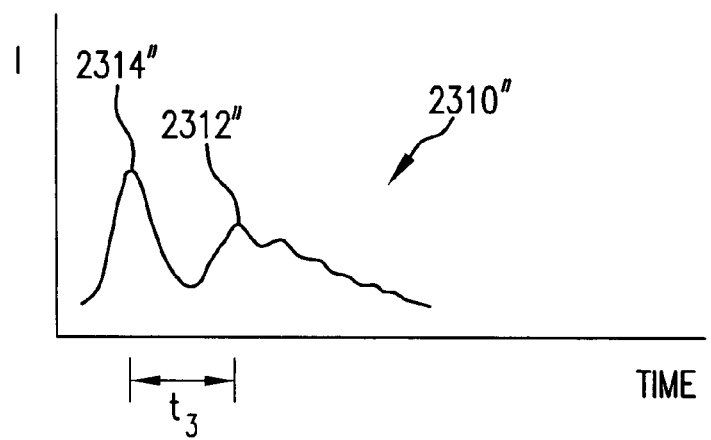
FIG. 10C illustrates yet another pulse shape that may be obtained using a pulse stretcher.

One specific pulse shape that may be optimal for some applications includes a pre-pulse peak followed by a more intense main pulse peak as illustrated in FIG. 10A and 10B. In more detail, FIG. 10A shows a shape for a pulse 2310 exiting a pulse stretcher wherein the reflectivity of the beam splitter has been selected such that the second peak 2312 is larger in intensity than the first peak 2314, and the delay path length has been selected such that the first two peaks are separated by a time $t_1$. For illustrative purposes, FIG. 10B shows a shape for a pulse 2310' exiting a pulse stretcher wherein the reflectivity of the beam splitter is roughly the same as the beam splitter corresponding to FIG. 10A and thus the second peak 2312' is larger in intensity than the first peak 2314', but a longer delay path length has been employed and now the two peaks are separated by a time $t_2$, with $t_2 > t_1$. On the other hand, FIG. 10C shows, again for illustrative purposes, a shape for a pulse 2310" exiting a pulse stretcher wherein the reflectivity of the beam splitter is less than the beam splitter corresponding to FIG. 10A and thus the second peak 2312" is smaller in intensity than the first peak 2314". Note that the delay path length for the pulse 2310" is roughly the same as the delay path length for the pulse 2310 resulting in a peak separation time $t_3$, with $t_3 = t_1$. Thus, FIGS. 10A-C illustrate that a wide range of pulse shapes may be generated by varying the beam splitter reflectivity and delay path length.

Details of the use of a pre-pulse can be found in co-pending U.S. patent application Ser. No. 11/358,988 filed on Feb. 21, 2006, entitled LASER PRODUCED PLASMA EUV LIGHT SOURCE WITH PRE-PULSE, the entire contents of which are hereby incorporated by reference herein.

Figure 11:
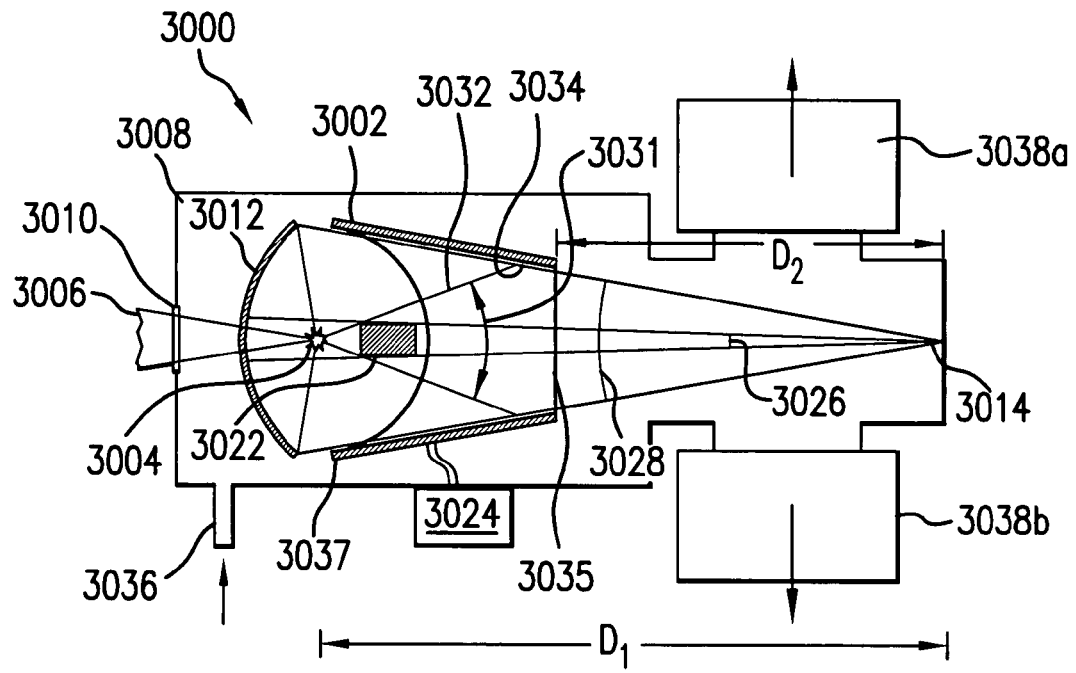
FIG. 11 shows a schematic, sectional view of an EUV light source having a receiving structure positioned to receive source material from an irradiation zone.

FIG. 11 shows a device 3000 having a receiving structure 3002 positioned to receive source material from an irradiation zone 3004. As disclosed herein, depending on the specific application, the receiving structure 3002 may be used alone or in combination with one or more other debris mitigation techniques such as the use of an ion slowing gas as described above, the use of a foil shield (with or without an ion slowing or deflecting gas), the use of an electric and/or magnetic field(s) to deflect or slow ions, and the use of a pulse-shaped beam (as described above).

As illustrated by FIG. 11, the device 3000 may include a laser source (not shown) generating a laser beam 3006 which enters a chamber 3008 via laser input window 3010 and irradiates a source material at the irradiation zone 3004 to form a plasma and emit EUV light. Mirror 3012 (e.g., multi-layer ellipsoidal mirror) may be disposed in the chamber 3008 and positioned to direct EUV light to an intermediate region 3014, as shown. Intermediate region 3014 may be a focal spot, as shown, or may have some other shape, e.g., having a ring shaped cross-section, etc. depending on the shape and configuration of the mirror 3012.

FIG. 11 further shows that the receiving structure 3002 is positioned at a distance, $D_2$ from the intermediate region 3014, the intermediate region 3014 is positioned at a distance, $D_1$, from the irradiation zone 3004, and from FIG. 11 it can be seen that $D_1 > D_2$. For the particular embodiment of the receiving structure 3002 shown in FIGS. 11-13, it can be seen that the receiving structure 3002 may include a conical shaped shell 3016 may define an axis 3018 and the receiving structure 3002 may further comprise a plurality (in this case six) of radially oriented vanes 3020 (see also FIG. 4D which illustrates nested conical vanes). A beam stop 3022 may be provided, as shown. For the device 3000, the beam stop 3022 may be separate from, attached to or formed integral with the receiving structure 3002.

Continuing with FIG. 11, a temperature control system 3024 may be provided for heating and/or cooling the receiving structure 3002 to maintain the receiving structure 3002 at a pre-selected operating temperature (or within a pre-selected temperature range). For example, passageway(s) may be formed in the receiving structure 3002 for passing a heat-exchange fluid such as water or liquid gallium. The heat-exchange fluid may then pass through one or more heating and/or cooling subsystems in the temperature control system 3024. Alternatively, or in addition to the external heating and/or cooling subsystems described above, one or more heaters, e.g., resistive heaters, etc. and/or cooling units, e.g., utilizing joule-thompson expansion, may be embedded within the receiving structure 3002.

In the operation of the device 3000, a target material, such as a droplet, is irradiated by one or more pulses to generate a plasma. Typically, irradiated target material moves along the beam direction and spreads into a wide solid angle. A large portion of the material may be collected by the beam stop 3022, which also may be temperature controlled. For example, a temperature controlled beam stop for collecting and directing LPP target material is disclosed and claimed in co-pending U.S. patent application Ser. No. 11/509,925 filed on Aug. 25, 2006, entitled SOURCE MATERIAL COLLECTION UNIT FOR A LASER PRODUCED PLASMA EUV LIGHT SOURCE, the entire contents of which are hereby incorporated by reference herein.

By-products of the target material irradiation may include metal dust, target material vapor and micro-droplets or clusters and can be in several forms, for example, when tin, e.g., pure tin, or a tin compound, e.g., $SnBr_4$, $SnH_4$, $SnBr_2$ etc, is used as the source material, the by-products may include tin and tin compounds including oxides. Dusts and other contaminates, e.g., from collector mirror erosion, etc. may also be present in the chamber. These by-products may, among other things, damage optics and absorb/scatter EUV radiation.

By way of example, and not limitation, the receiving structure 3002 may function to collected liquids and solids (in some cases remelting solids) and/or condensing vapors. For a target material containing Sn, some or all of the operable surfaces of the receiving structure 3002 may be maintained at a temperature above the melting point of Sn, e.g., above about 230 C. At this temperature, micro-droplets may stick to the surface of the receiving structure 3002, and in some cases, flow downwardly by gravitational force. Solidified metal dust may be remelted into the molten material and also flow downward. The compounds of Sn (e.g., oxides) may also be trapped by the liquid flow and removed from the chamber. The receiving structure 3002 may have inter-connecting channels (not shown) for directing liquid metal flow from surfaces to the bottom where the liquid metal may be collected. The location and direction of the channels may be configured relative to the EUV source orientation (e.g. the light source axis may be tilted relative to horizontal at about 28 degrees) to ensure proper flow of liquid on the receiving structure 3002 On the other hand, in some application some or all of the operable surfaces of the receiving structure 3002 may be maintained at a temperature below the melting point of Sn, e.g., below about 230 C (for a target material containing Sn). At these temperatures, condensation is promoted and liquids and solids may be allowed to accumulate on the receiving structure 3002.

The receiving structure 3002 may also function as a cold trap condensing vapors, e.g., Sn vapor present in the chamber. The following table shows Sn vapor pressure at various temperatures.

| Temperature, C.: | 400 C. | 500 C. | 600 C. |
|---|---|---|---|
| Vapor pressure, torr | $4.4 * 10^{-15}$ | $3.6 * 10^{-12}$ | $6.3 * 10^{-10}$ |

A typical operation of the device 3000 may involve maintaining the receiving structure 3002 in the range of 250-500 C. The Sn vapor equilibrium pressure may be estimated to be less than about $10^{-11}$ torr. For the device 3000, Sn vapor passing through the receiving structure 3002 can diffuse to the wall of the receiving structure 3002 and condense on the wall if the vapor pressure is less than equilibrium pressure at a given temperature.

The attenuation of the vapor concentration due to condensation on the walls is generally defined by the aspect ratio. For flat, spaced-apart parallel plates having an infinite width, the concentration, n as a function of plate length, is described by the formula:

$$n = n_0 e^{-\frac{\pi x}{2a}} \cos\left(\frac{\pi y}{2a}\right) \quad (1)$$

where $n_0$ is vapor concentration at the entrance, x is the coordinate along the channel and a is the distance between the plates. The cosine function describes the radial profile. For a cylinder channel, the distribution is described by:

$$n(x, r) \approx n_0 e^{-\frac{2.4x}{R}} J_0\left(\frac{2.4r}{R}\right) \quad (2)$$

where R is the cylinder radius and the radial distribution is described by Bessel function, $J_0$. Thus, for both plates and cylinders, a high aspect ratio x/a or x/R in the exponent results in a large attenuation of vapor pressure along the length of the plates or cylinder in the case of a large aspect ratio. From this analysis, it is to be appreciated that for the receiving structures 3002, 3002' shown in FIGS. 11-16, the vapor pressure attenuation will depend on the spacing between the radially oriented vanes 3020, 3020'.

FIG. 11 illustrates that the EUV light utilizing tool, e.g. lithography scanner (not shown) may only utilize EUV light between a minimum NA angle 3026 and a maximum NA angle 3028. For such a tool, the receiving structure 3002 may be sized and configured such that a central portion 3030 of the receiving structure 3002 is located within the minimum NA angle 3026 and the conical shaped shell 3016 may be disposed at, near or outside the maximum NA angle 3028.

Typically, for the device 3000, a significant amount of material may spread beyond the solid angle 3031 and thus miss the beam stop 3022, the solid angle 3031 being limited, as shown, by the lines 3032 coming from the irradiation region 3004 and extending to and reaching the receiving structure 3002 at intersection point 3034. Also shown, the receiving structure 3002 may extend past the intersection point 3034 and toward the intermediate region 3014. Thus, the edge 3035 of the receiving structure 3002 may be positioned between the intersection point 3034 and the intermediate region 3014. At the other extreme, the edge 3037 of the receiving structure 3002 may be attached to or positioned near the mirror 3012. Ports (not shown) may be provided to allow auxiliary equipment, e.g., droplet generator, metrology equipment, etc., to interact with the irradiation zone 3004.

FIG. 11 also shows that the device 3000 may include an input port 3036 and exhaust pumps 3038a,b, e.g., turbopumps, to introduce and exhaust one or more gases. These gasses can be used for ion slowing (as described above) and/or to etch/clean one or more optics, e.g., mirror 3012, and/or to assist in the collection of dust/vapor by the receiving structure 3002.

Figures 12, 13:
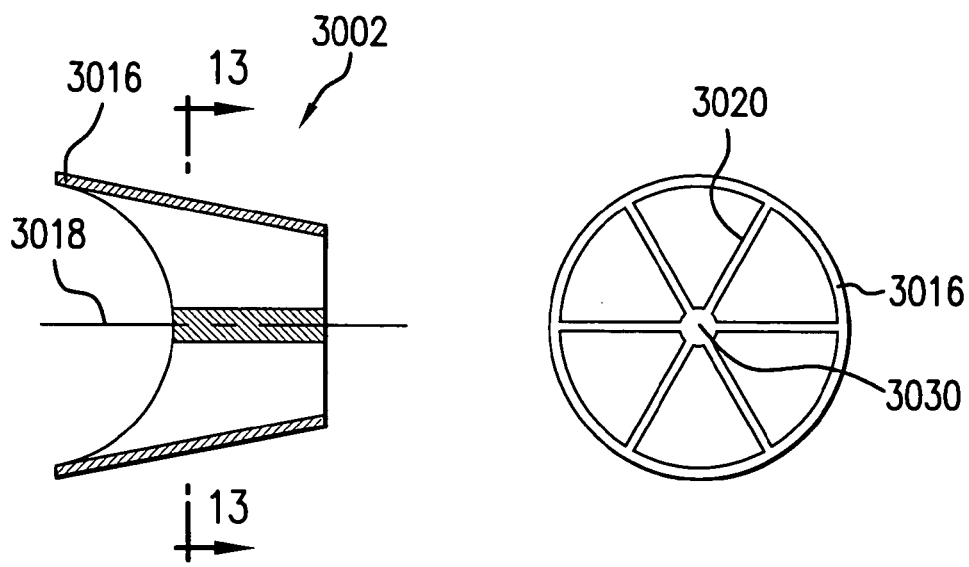
FIG. 12 shows a detail view of the receiving structure shown in FIG. 11.
FIG. 13 shows a sectional view of a receiving structure as seen along line 13-13 in FIG. 12.
Figure 14:
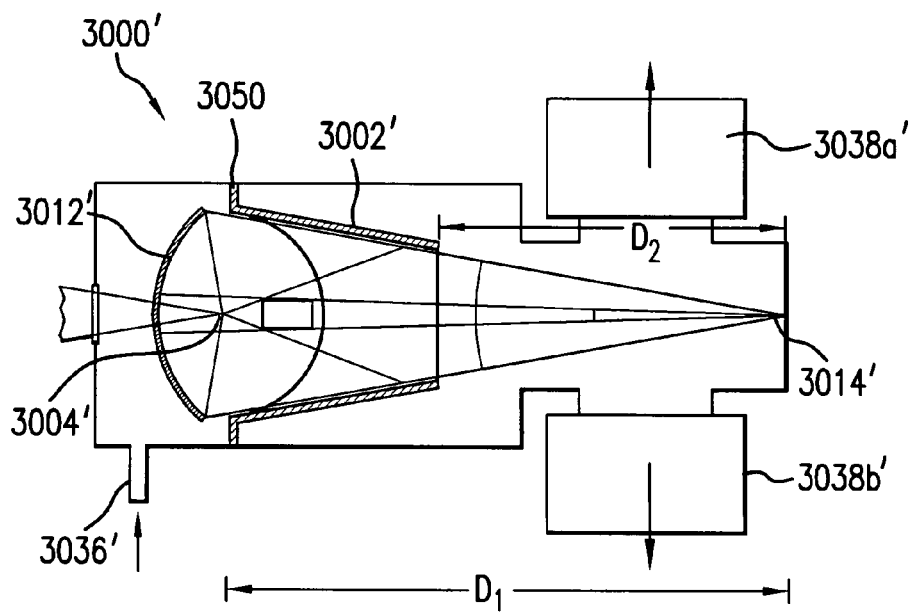
FIG. 14 illustrates another embodiment of a receiving structure positioned in an EUV light source.
Figure 15:
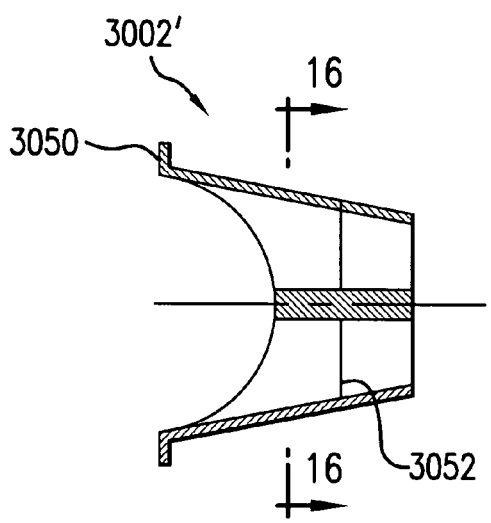
FIG. 15 shows a detail view of the receiving structure shown in FIG. 14.
Figure 16:
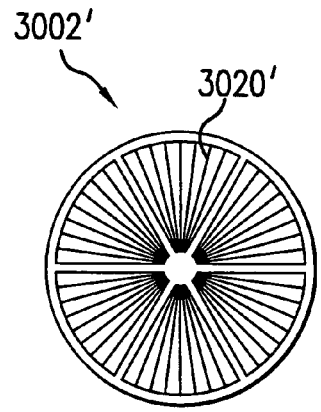
FIG. 16 shows a sectional view of a receiving structure as seen along line 16-16 in FIG. 15.

FIGS. 14-16 illustrate another embodiment of a receiving structure 3002' which includes additional radial vanes 3020' (as compared to receiving structure 3002 shown in FIGS. 11-13). These additional vanes 3020' result in an increased aspect ratio, and as a consequence, increased attenuation of vapor penetration through the receiving structure 3002'. It is to be appreciated that some attenuation of EUV may occur from vanes 3020', as well, but this small EUV attenuation may be less than gain in total EUV transmission due to high drag of the receiving structure 3002' with vanes to the gas flow. This 'drag' may create a differential between the pressure at the irradiation zone 3004'and the intermediate region 3014'. The lower pressure near the intermediate region 3014' results in less EUV absorption while. the higher pressure near the irradiation zone 3004' may be useful to slow ions and/or etch/clean optics, e.g., mirror 3012'. For the receiving structure 3002' the radial vanes 3020' may be located in shaded areas defined by scanner optics reduce blocking usable EUV light from reaching the intermediate region 3014'.

FIGS. 14 and 15 also show that the receiving structure 3002' wall may be sealed to the wall of the chamber by seal 3050 which may be separate from or formed integrally with the receiving structure 3002'.

FIG. 14 also shows that the device 3000' may include an input port 3036' and exhaust pumps 3038a',b', e.g., turbopumps, to introduce and exhaust one or more gases. These gasses can be used for ion slowing (as described above) and/or to etch/clean one or more optics, e.g., mirror 3012', and/or to assist in the collection of dust/vapor by the receiving structure 3002'. With this cooperation of structure, gas will flow through the channels in the receiving structure 3002' formed by the vanes 3020'. In the case of viscous flow (which is true if the mean free path is less than the distance between the vanes 3020') the pressure difference between front and distant sides of the receiving structure 3002' will be reverse proportional to the square of the distance between vanes 3020'. At a certain distance most of pressure will drop on the receiving structure 3002' and at the required pressure in. plasma region for stopping the ions, the pressure behind the receiving structure 3002 will be very small, thus the total attenuation of EUV may be less than without vanes. The length of the vanes (position of the distant edge 3052 in FIG. 15) may be optimized to increase the volume of low pressure gas near the intermediate region 3014'.

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A device comprising:
a system generating a plasma at a plasma site, the plasma producing EUV radiation and ions exiting the plasma;
a near-normal incidence EUV mirror distanced from the site by a distance, d; and
a flowing gas disposed between the plasma and the mirror, the gas establishing a gas pressure sufficient to operate over the distance, d, to reduce ion energy below 100eV before the ions reach the mirror.

2. A device as recited in claim 1 wherein the gas comprises hydrogen.

3. A device as recited in claim 2 wherein the gas comprises greater than 50 percent hydrogen by volume.

4. A device as recited in claim 3 further comprising an on-demand hydrogen generation system.

5. A device as recited in claim 4 wherein the gas comprises hydrogen and the device further comprises a source of diluting gas to mix with exhausted hydrogen prior to release.

6. A device as recited in claim 1 wherein the gas comprises deuterium.

7. A device as recited in claim 1 wherein the plasma comprises Sn.

8. A device as recited in claim 1 wherein the mirror is a multi-layer mirror.

9. A device as recited in claim 1 wherein the system comprises a droplet generator providing droplets and a laser illuminating droplets to create the plasma.

10. A device as recited in claim 9 wherein the laser comprises a gain media and the gain media comprises $CO_2$.

11. A device as recited in claim 1 wherein the system comprises a chamber, the mirror and plasma are disposed within the chamber, and wherein the gas is introduced into the chamber and exhausted therefrom during plasma generation.

12. A device as recited in claim 1 wherein the gas comprises hydrogen and the pressure is greater than 100 mTorr.

13. A device as recited in claim 1 wherein the gas flow rate is greater than 100 sccm.

14. A device as recited in claim 1 wherein the mirror directs EUV light to an intermediate location and the device further comprises a multi-channel pressure-reducing structure disposed between the plasma and the intermediate location.

15. A device as recited in claim 1 wherein the gas establishes a gas pressure sufficient to operate over the distance, d, to reduce ion energy below 30 eV before the ions reach the optic.

16. A device comprising:
a system generating a plasma at a plasma site, the plasma producing EUV radiation and ions exiting the plasma
an optic distanced from the site by a distance, d;
a gas comprising a halogen, the gas disposed between the plasma and optic, the gas establishing a gas pressure sufficient to operate over the distance, d, to reduce ion energy below 100eV before the ions reach the optic.

17. A device as recited in claim 16 wherein the halogen comprises bromine.

18. A device as recited in claim 16 wherein the gas establishes a gas pressure sufficient to operate over the distance, d, to reduce ion energy below 30 eV before the ions reach the optic.

19. A device comprising:
a system generating a plasma at a plasma site, the plasma producing EUV radiation and ions exiting the plasma, the system comprising an irradiation source having a pulse shaper, the source producing a pulse-shaped beam for irradiating a target material to produce a plasma having lower initial ion energies than a corresponding unshaped beam:
an optic distanced from the site by a distance, d;
a gas disposed between the plasma and optic, the gas establishing a gas pressure sufficient to operate over the distance, d, to reduce ion energy below 100 eV before the ions reach the optic.

20. A device as recited in claim 19 wherein the pulse-shaped beam comprises at least one pre-pulse and at least one main-pulse.

21. A device as recited in claim 19 wherein the pulse shaper comprises a saturable absorber.

22. A device as recited in claim 19 wherein the pulse shaper comprises an optical arrangement creating a laser spark.

23. A device as recited in claim 19 wherein the pulse shaper comprises a shutter operable to trim a pulse.

24. A device as recited in claim 19 wherein the pulse shaper comprises a pulse stretcher.

25. A device as recited in claim 19 wherein the gas establishes a gas pressure sufficient to operate over the distance, d, to reduce ion energy below 30 eV before the ions reach the optic.

26. A device comprising:
a laser source generating a laser beam;
a source material irradiated by said laser beam at an irradiation zone to form a plasma and emit EUV light;
a mirror reflecting EUV light to an intermediate region, the intermediate region distanced from the irradiation zone by a distance, $D_1$; and
a receiving structure positioned to receive source material from the irradiation zone, the receiving structure formed with at least one passageway allowing EUV light to travel from the mirror to the intermediate region, the receiving structure distanced from the intermediate region by a distance, $D_2$, with $D_1 > D_2$.

27. A device as recited in claim 26 wherein the receiving structure comprises a conical shaped shell.

28. A device as recited in claim 27 wherein the conical shaped shell defines an axis and the receiving structure further comprises a plurality of radially oriented vanes.

29. A device as recited in claim 26 further comprising a temperature control system for the receiving structure.

30. A device as recited in claim 26 wherein the source material comprises tin and at least a portion of the receiving structure is maintained at a temperature above the melting point of tin.

31. A device as recited in claim 26 wherein the mirror is distanced from the irradiation zone by a distance, d and a flowing gas is disposed between the irradiation zone and mirror, the gas establishing a gas pressure sufficient to operate over the distance, d, to reduce ion energy below 100 eV before the ions reach the optic.

32. A device as recited in claim 31 wherein the gas establishes a gas pressure sufficient to operate over the distance, d, to reduce ion energy below 30 eV before the ions reach the optic.

* * * * *